United States Patent
Lee et al.

(10) Patent No.: US 12,069,926 B2
(45) Date of Patent: Aug. 20, 2024

(54) DISPLAY DEVICE AND METHOD OF MANUFACTURING THE SAME

(71) Applicant: SAMSUNG DISPLAY CO., LTD., Yongin-si (KR)

(72) Inventors: Jin Hyeong Lee, Suwon-si (KR); Su Jeong Kim, Seoul (KR); Jin A Seo, Seoul (KR); Yi Seop Shim, Suwon-si (KR); Yun Ho Lee, Cheonan-si (KR); Eun Bee Lee, Hwaseong-si (KR); Sung Gyu Jang, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/359,921

(22) Filed: Jun. 28, 2021

(65) Prior Publication Data
US 2022/0028932 A1  Jan. 27, 2022

(30) Foreign Application Priority Data
Jul. 23, 2020  (KR) ........................ 10-2020-0091885

(51) Int. Cl.
*G06F 3/041* (2006.01)
*H10K 50/844* (2023.01)
(Continued)

(52) U.S. Cl.
CPC ........... *H10K 59/38* (2023.02); *G06F 3/0412* (2013.01); *H10K 50/844* (2023.02); *H10K 59/12* (2023.02);
(Continued)

(58) Field of Classification Search
CPC ............... G06F 3/04164; G06F 3/0448; G06F 2203/04102; G06F 3/044; G06F 3/0445; G06F 2203/04111; G06F 3/041; G06F 3/047; G06F 3/0412; G06F 2203/04112; G06F 3/0443; G06F 3/0446; G02F 1/133512; G02F 1/133553; G02F 1/1343; G02F 1/133514; G02F 1/136209;
(Continued)

(56) References Cited

U.S. PATENT DOCUMENTS 10,991,768 B2 * 4/2021 Li ...................... H01L 27/3216
2013/0277679 A1 * 10/2013 Yamazaki .............. H10K 59/12
257/72

(Continued)

FOREIGN PATENT DOCUMENTS

KR  10-2017-0109184  9/2017
KR  10-2019-0073149  6/2019

*Primary Examiner* — Lunyi Lao
*Assistant Examiner* — Jarurat Suteerawongsa
(74) *Attorney, Agent, or Firm* — F. CHAU & ASSOCIATES, LLC

(57) ABSTRACT

A display device includes first to third light emitting units disposed on a substrate, an encapsulation layer disposed on the first to third light emitting units, a sensor electrode disposed on the encapsulation layer, an insulating layer disposed on the sensor electrode, first to third color filters disposed on the touch insulating layer and overlapping the first to third light emitting units in a thickness direction of the substrate, respectively. The sensor electrode overlaps at least one of the first color filter, the second color filter, and the third color filter in the thickness direction of the substrate.

20 Claims, 23 Drawing Sheets

(51) Int. Cl.
*H10K 59/12* (2023.01)
*H10K 59/38* (2023.01)
*H10K 59/40* (2023.01)
*G06F 3/044* (2006.01)

(52) U.S. Cl.
CPC ......... *H10K 59/40* (2023.02); *G06F 3/04164* (2019.05); *G06F 3/0443* (2019.05); *G06F 3/0446* (2019.05); *G06F 2203/04111* (2013.01)

(58) Field of Classification Search
CPC ......... G09G 2300/0426; G09G 3/3208; G09G 3/2003; G09G 2300/0452; H01L 27/322; H01L 27/3258; H01L 51/5284; H01L 27/3216; H01L 27/3211; H01L 27/14621; H01L 27/323; H01L 27/3248; H01L 51/5253; G02B 5/201; H10K 59/38; H10K 50/844; H10K 59/12; H10K 59/40; H10K 59/123; H10K 59/35
See application file for complete search history.

(56) References Cited

U.S. PATENT DOCUMENTS

| | | | |
|---|---|---|---|
| 2016/0274693 A1* | 9/2016 | Liu | H10K 59/40 |
| 2016/0358543 A1* | 12/2016 | Rappoport | G09G 3/3225 |
| 2018/0101258 A1* | 4/2018 | Cho | G06F 3/041 |
| 2018/0164933 A1* | 6/2018 | Jun | H01L 51/5237 |
| 2018/0182814 A1* | 6/2018 | Kim | H01L 27/322 |
| 2018/0182817 A1* | 6/2018 | Jo | G06F 3/0412 |
| 2018/0182821 A1* | 6/2018 | Yun | H10K 59/131 |
| 2019/0013363 A1* | 1/2019 | Joo | H01L 27/322 |
| 2019/0018530 A1* | 1/2019 | Lee | H10K 50/8445 |
| 2019/0146622 A1* | 5/2019 | Kang | G06F 3/0412 345/173 |
| 2019/0179466 A1* | 6/2019 | Kim | G09G 3/3291 |
| 2019/0252470 A1* | 8/2019 | Lee | H10K 59/873 |
| 2019/0341428 A1* | 11/2019 | Lee | H10K 50/125 |

\* cited by examiner

DISPLAY DEVICE AND METHOD OF MANAUFACTURING THE SAME

CROSS-REFERENCE TO RELATED APPLICATION

This application claims priority under 35 U.S.C. § 119 to Korean Patent Application No. 10-2020-0091885, filed on Jul. 23, 2020, the disclosure of which is incorporated by reference herein in its entirety.

TECHNICAL FIELD

The present invention relates to a display device and a method of manufacturing the same.

DISCUSSION OF THE RELATED ART

With the development of information society, requirements for display devices for displaying images have increased in various forms. For example, display devices are applied to various electronic appliances such as smart phones, digital cameras, notebook computers, navigators, and smart televisions.

A display device includes an anti-reflection member such as a polarizing plate attached on a display panel to reduce the reflection of external light by metal lines of the display panel. Recently, to reduce the manufacturing costs of a display device, a color filter layer including a color filter and a black matrix instead of a polarizing plate has been used as an anti-reflection member.

SUMMARY

A display device can reduce the manufacturing costs of a color filter layer used as an anti-reflection member by omitting a black matrix to reduce the number of mask processes, and a method of manufacturing the same.

A display device includes a substrate, a first light emitting unit disposed on the substrate and emitting light of a first color, a second light emitting unit disposed on the substrate and emitting light of a second color, a third light emitting unit disposed on the substrate and emitting light of a third color, an encapsulation layer disposed on the first light emitting unit, the second light emitting unit, and the third light emitting unit, a sensor electrode disposed on the encapsulation layer, a first insulating layer disposed on the sensor electrode, a first color filter disposed on the first insulating layer and overlapping the first light emitting unit in a thickness direction of the substrate, a second color filter disposed on the first insulating layer and overlapping the second light emitting unit in the thickness direction of the substrate, and a third color filter disposed on the first insulating layer and overlapping the third light emitting unit in the thickness direction of the substrate. The sensor electrode overlaps at least one of the first color filter, the second color filter, and the third color filter in the thickness direction of the substrate.

A display device includes a substrate, a first light emitting unit disposed on the substrate and emitting light of a first color, an encapsulation layer disposed on the first light emitting unit, a sensor electrode disposed on the encapsulation layer, and a first color filter disposed on the sensor electrode and overlapping the first light emitting unit in a thickness direction of the substrate. The sensor electrode, when the display device is viewed in a top down view, does not overlap the first light emitting unit in the thickness direction of the substrate. The first color filter overlaps the sensor electrode in the thickness direction of the substrate. The sensor electrode includes a first conductive layer and a second conductive layer disposed on the first conductive layer. A thickness of the first conductive layer is greater than a thickness of the second conductive layer. An electrical conductivity of the first conductive layer is higher than an electrical conductivity of the second conductive layer. A reflectance of the first conductive layer is higher than a reflectance of the second conductive layer.

BRIEF DESCRIPTION OF THE DRAWINGS

The above and other features of the present inventive concept will become more apparent by describing in detail embodiments thereof with reference to the accompanying drawings, in which.

DETAILED DESCRIPTION OF THE EMBODIMENTS

Figure 1:
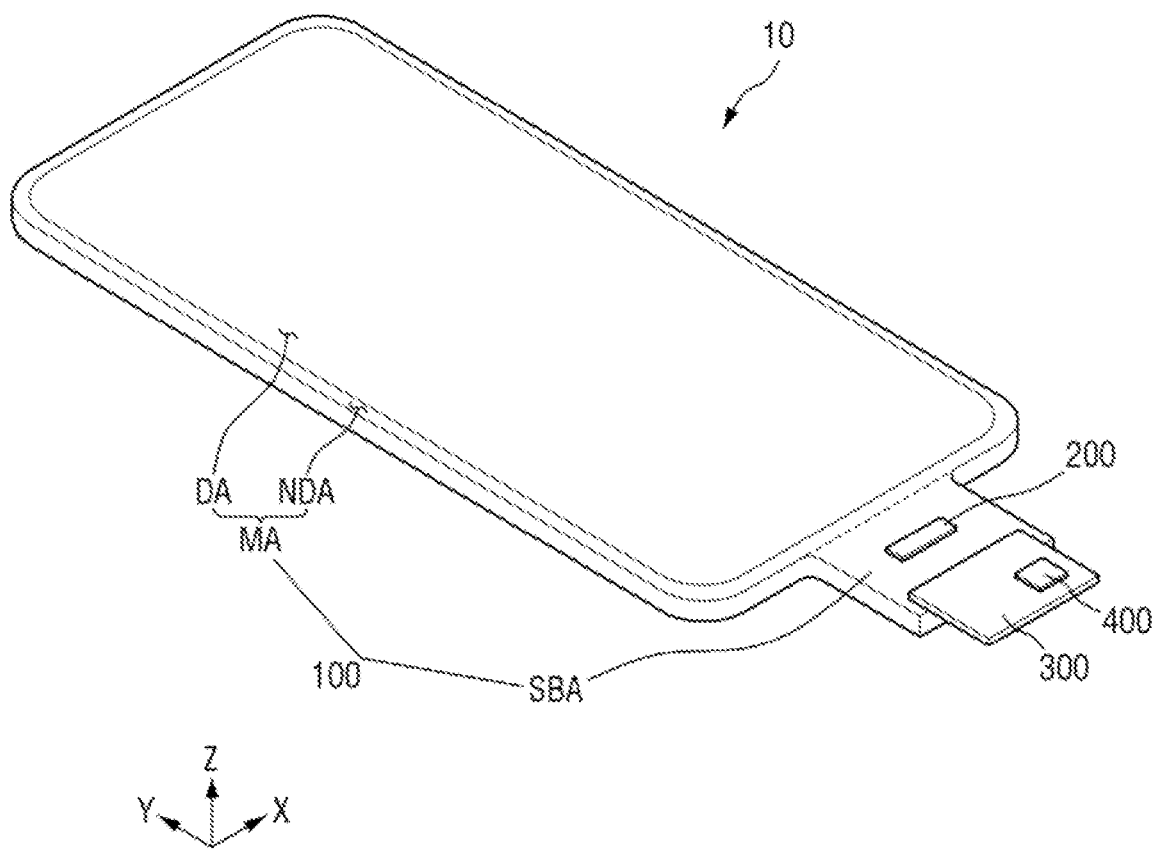
FIG. 1 is a perspective view of a display device according to an embodiment according to the present invention.

Embodiments of the present inventive concept will be described more fully hereinafter with reference to the accompanying drawings. Like reference numerals may refer to like elements throughout the specification and the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each embodiment are available for other similar features or aspects in other embodiments, unless the context clearly indicates otherwise. Thus, it is contemplated that all features and structures described herein may be mixed and matched in any desirable manner.

As used herein, the singular forms "a", "an" and "the" are intended to include the plural forms as well, unless the context clearly indicates otherwise.

Spatially relative terms, such as "below", "lower", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below.

Figure 2:
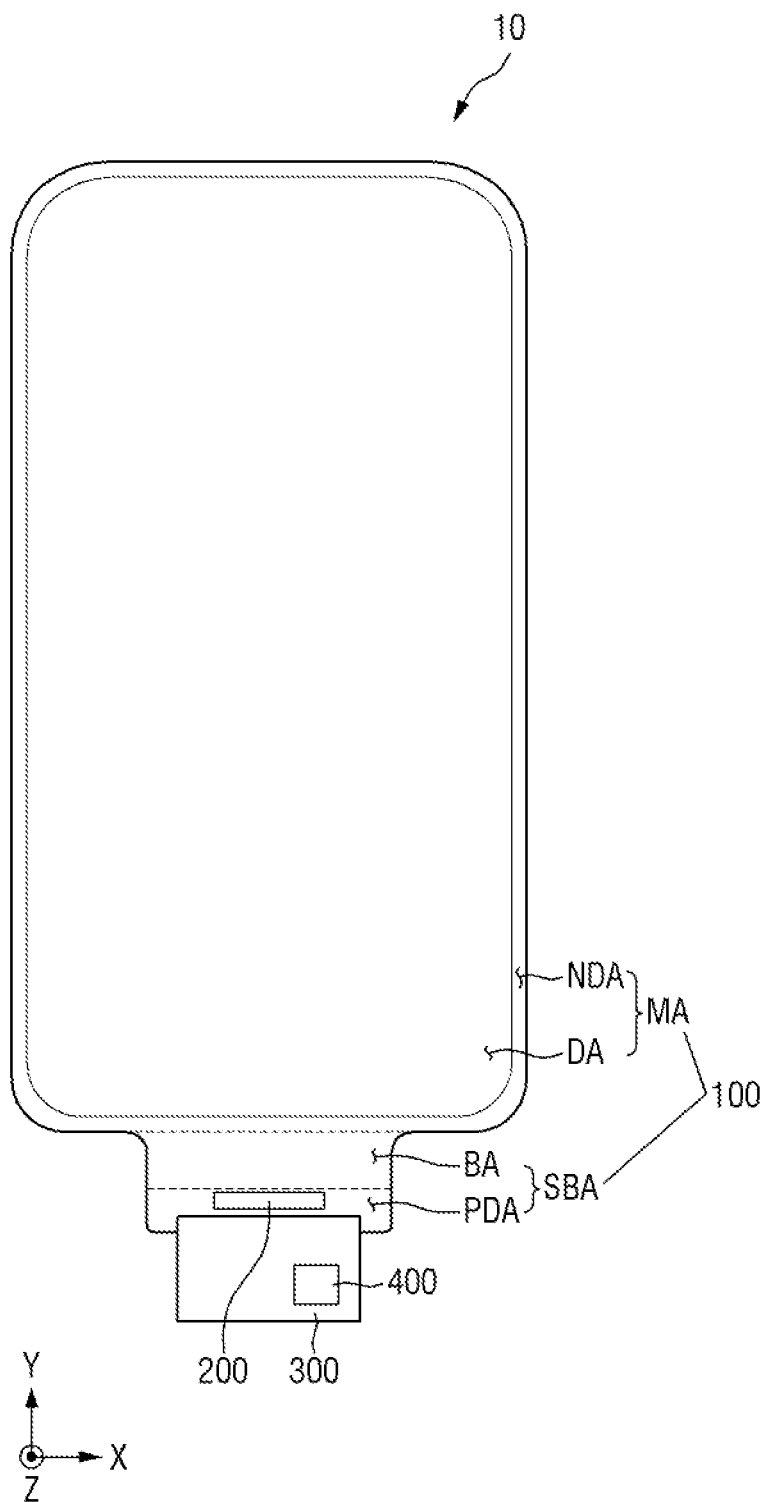
FIG. 2 is a plan view of a display device according to an embodiment according to the present invention.
Figure 3:
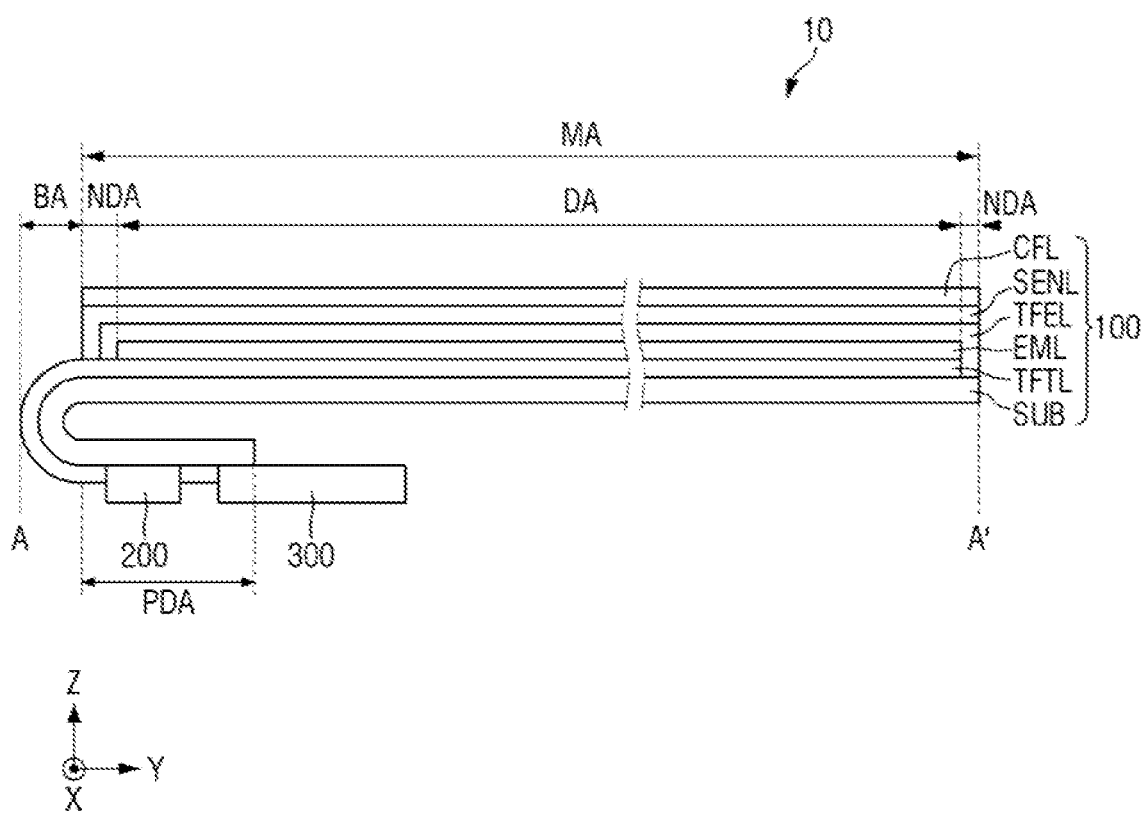
FIG. 3 is a side view of a display device according to an embodiment according to the present invention.

FIG. 1 is a perspective view of a display device according to an embodiment, FIG. 2 is a plan view of a display device according to an embodiment, and FIG. 3 is a side view of a display device according to an embodiment.

Referring to FIGS. 1 to 3, a display device 10 according to an embodiment may be applied to a portable electronic appliance such as a mobile phone, a smart phone, a tablet personal computer (table PC), a mobile communication terminal, and electronic notebook, an e-book, a portable multimedia player (PMP), a navigator, or ultra mobile PC (UMPC). Alternatively, the display device 10 according to an embodiment may be applied to a display unit of a television, a notebook, a monitor, a billboard, or internet of things (JOT). Alternatively, the display device 10 according to an embodiment may be applied to a wearable device such as a smart watch, a watch phone, an eyeglass display, or a head mounted display (HMD). Alternatively, the display device 10 according to an embodiment may be applied to a center information display placed in a car instrument panel, a car center fascia or a carbon dashboard, a room mirror display replacing a car side mirror, or a display placed on the back surface of a front seat as an entertainment for a back seat of a car.

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro or nano light emitting display device using a micro or nano light emitting diode (micro LED or nano LED). Hereinafter, the display device 10 will be mainly described as an organic light emitting display device, but the present invention is not limited thereto.

The display device 10 includes a display panel 100, a display driving circuit 200, a display circuit board 300, and a touch driving circuit 400.

The display panel 100 may have a rectangular planar shape having short sides extending in the first direction (X-axis direction) and long sides extending in the second direction (Y-axis direction). The corner where the short side in the first direction (X-axis direction) meets the long side in the second direction (Y-axis direction) may be formed to have a round shape of a predetermined curvature or have a right angle shape. The planar shape of the display panel 100 is not limited to a rectangular shape, and may be formed in another polygonal shape, circular shape, or elliptical shape. The display panel 100 may be formed to be flat, but the present invention is not limited thereto. For example, the display panel 100 may include a curved portion formed at the left and right ends thereof and having a constant curvature or a variable curvature. In addition, the display panel 100 may be flexible to be bent, warped, folded, or rolled.

The display panel 100 may include a main area MA and a sub-area SBA.

The main area MA includes a display area DA that displays an image and a non-display area NDA that is a peripheral area of the display area DA. The display area DA includes pixels (PX in FIG. 5) displaying an image. The sub-area SBA may protrude from one side of the main area MA in the second direction (Y-axis direction).

Although FIGS. 1 and 2 illustrate a case where the sub-area SBA is unfolded, the sub-area SBA may be bent as shown in FIG. 3, and in this case, the sub-area SBA is disposed on the lower surface of the display panel 100. When the sub-area SBA is bent, the sub-area SBA may overlap the main area MA in the thickness direction (Z-axis direction) of the display panel 100.

As shown in FIG. 3, the display panel 100 includes a substrate SUB, a thin film transistor layer TFTL, a light emitting element layer EML, an encapsulation layer TFEL, a touch sensing layer SENL, and a color filter layer CFL.

The thin film transistor layer TFTL may be disposed on the substrate SUB. The thin film transistor layer TFTL may be disposed in the main area MA and the sub-area SBA. The thin film transistor layer TFTL includes transistors (ST1 in FIG. 7).

The light emitting element layer EML may be disposed on the thin film transistor layer TFTL. The light emitting element layer EML may be disposed on the display area DA of the main area MA. The light emitting element layer EML includes light emitting elements disposed in light emitting units.

The encapsulation layer TFEL may be disposed on the light emitting element layer EML. The encapsulation layer TFEL may be disposed in the display area DA and non-display area NDA of the main area MA. The encapsulation layer TFEL includes at least one inorganic material layer and at least one organic layer for encapsulating the light emitting element layer EML.

The touch sensing layer SENL may be disposed on the encapsulation layer TFEL. The touch sensing layer SENL may be disposed in the display area DA and non-display area NDA of the main area MA. The touch sensing layer SENL may sense a touch of a person or an object using sensor electrodes.

The color filter layer CFL may be disposed on the touch sensing layer SENL. The color filter layer CFL may be disposed in the display area DA and non-display area NDA of the main area MA. The color filter layer CFL may be an anti-reflection member for reducing the reflection of external light from metal lines and metal electrodes of the display panel 100. The color filter layer CFL includes a plurality of color filters. For example, the color filter layer CFL includes a first color filter that transmits light in a first wavelength range, a second color filter that transmits light in a second wavelength range, and a third color filter that transmits light in a third wavelength range.

A cover window for protecting the upper portion of the display panel 100 may be disposed on the color filter layer CFL. The cover window may be attached onto the color filter layer (CFL) by a transparent adhesive member such as an optically clear adhesive (OCA) film or an optically clear resin (OCR). The cover window may be an inorganic material such as glass, or an organic material such as plastic or polymer.

The display driving circuit 200 may generate signals and voltages for driving the display panel 100. The display driving circuit 200 may be formed as an integrated circuit (IC) and attached onto the display panel 100 by a chip on glass (COG) method, a chip on plastic (COP) method, or an ultrasonic bonding method, but the present invention is not limited thereto. For example, the display driving circuit 200 may be attached onto the display circuit board 300 in a COF (chip on film) method.

The display circuit board 300 may be attached to one end of the sub-area SBA of the display panel 100. Accordingly, the display circuit board 300 may be electrically connected to the display panel 100 and the display driving circuit 200. The display panel 100 and the display driving circuit 200 may receive digital video data, timing signals, and driving voltages through the display circuit board 300. The display circuit board 300 may be a flexible printed circuit board, a printed circuit board, or a flexible film such as a chip on film.

The touch driving circuit 400 may be disposed on the display circuit board 300. The touch driving circuit 400 may be formed as an integrated circuit (IC) and attached onto the display circuit board 300.

The touch driving circuit 400 may be electrically connected to sensor electrodes of the touch sensing layer SENL of the display panel 100. The touch driving circuit 400 applies driving signals to the sensor electrodes of the touch sensing layer SENL and measures mutual capacitance values of the sensor electrodes. The driving signals may be signals having a plurality of driving pulses. The touch driving circuit 400 may determine a user's touch or a user's proximity according to the mutual capacitance values. The user's touch indicates that an object such as a user's finger or a pen directly contacts one surface of the display device 10 disposed on the touch sensing layer SENL. The user's proximity indicates that an object such as a user's finger or a pen is placed apart from one surface of the display device 10.

As shown in FIGS. 1 to 3, to reduce the reflection of external light by metal lines and metal electrodes of the display panel 100, the display panel 100 includes the color filter layer CFL including color filters. For this reason, since it is not necessary to attach a separate anti-reflection member such as a polarizing plate onto the display panel 100, the manufacturing costs of the display device 10 may be reduced.

Figure 4:
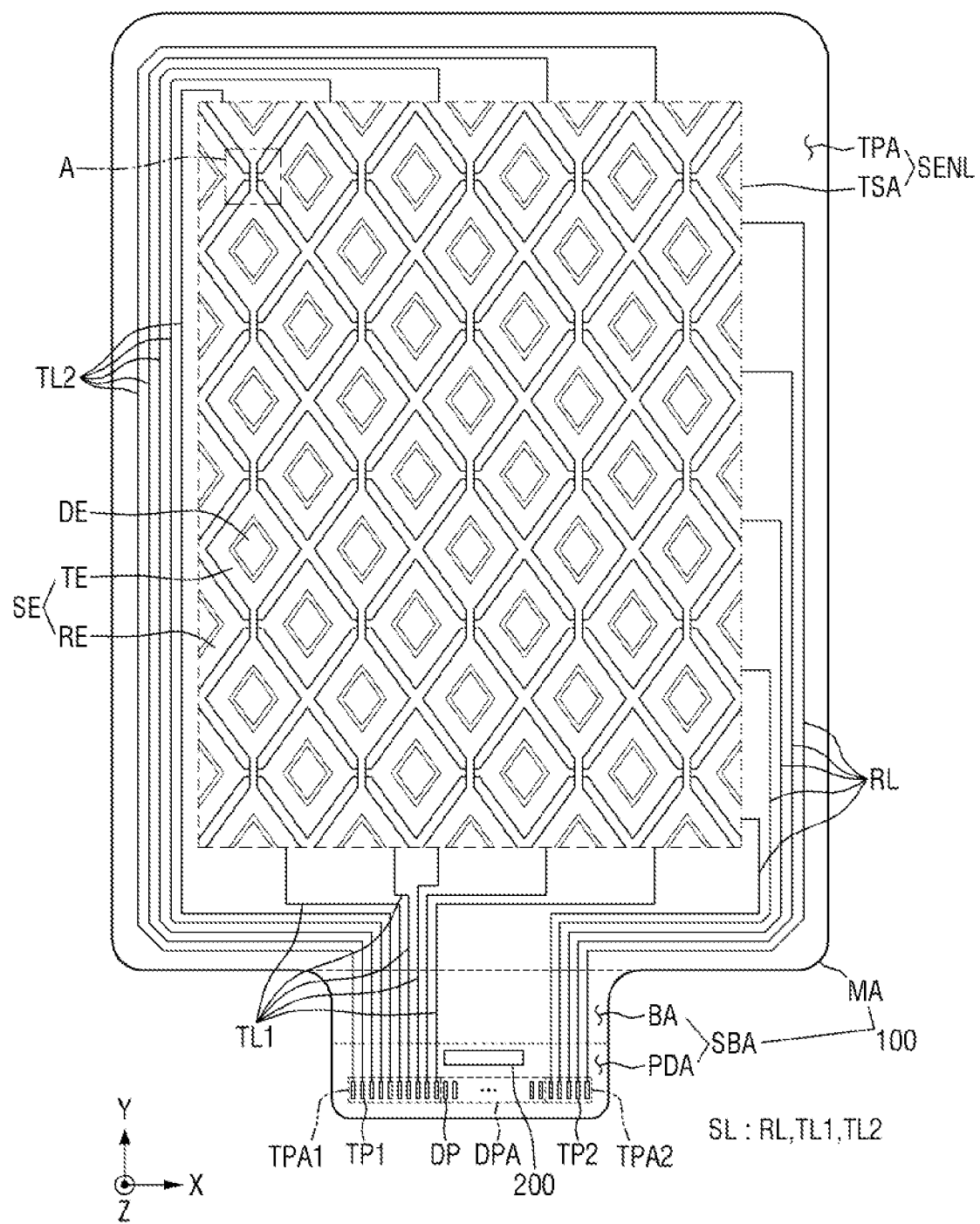
FIG. 4 is a layout view schematically illustrating an example of the touch sensing layer of FIG. 3 according to the present invention.

FIG. 4 is a layout view schematically illustrating an example of the touch sensing layer of FIG. 3.

Although it is mainly illustrated in FIG. 4 that the sensor electrodes SE of the touch sensing layer SENL may include two types of electrodes, for example, driving electrodes TE and sensing electrodes RE, and may be driven by a mutual capacitance method in which a voltage charged in mutual capacitance is sensed through the sensing electrodes RE after applying driving signals to the driving electrodes TE, the present invention is not limited thereto.

In FIG. 4, for convenience of description, only driving electrodes TE, sensing electrodes RE, dummy patterns DE, sensor lines TL1, TL2 and RL, and sensor pads TP1 and TP2 are shown.

Referring to FIG. 4, the touch sensing layer SENL includes a touch sensor area TSA for sensing a user's touch and a touch peripheral area TPA disposed around the touch sensor area TSA. The touch sensor area TSA may overlap the display area DA of FIGS. 1 to 3, and the touch peripheral area TPA may overlap the non-display area NDA of FIGS. 1 to 3.

The touch sensor area TSA includes driving electrodes TE, sensing electrodes RE, and dummy patterns DE. The driving electrodes TE and the sensing electrodes RE may be electrodes which form mutual capacitance to sense a touch of an object or a person.

The sensing electrodes RE may be arranged in the first direction (X-axis direction) and the second direction (Y-axis direction) to form a plurality of columns and rows. The sensing electrodes RE in each row may be electrically connected to each other in the first direction (X-axis direction). The sensing electrodes RE adjacent in the first direction (X-axis direction) may be connected to each other. The sensing electrodes RE in each column which are adjacent to each other in the second direction (Y-axis direction) may be electrically separated from each other.

Figure 5:
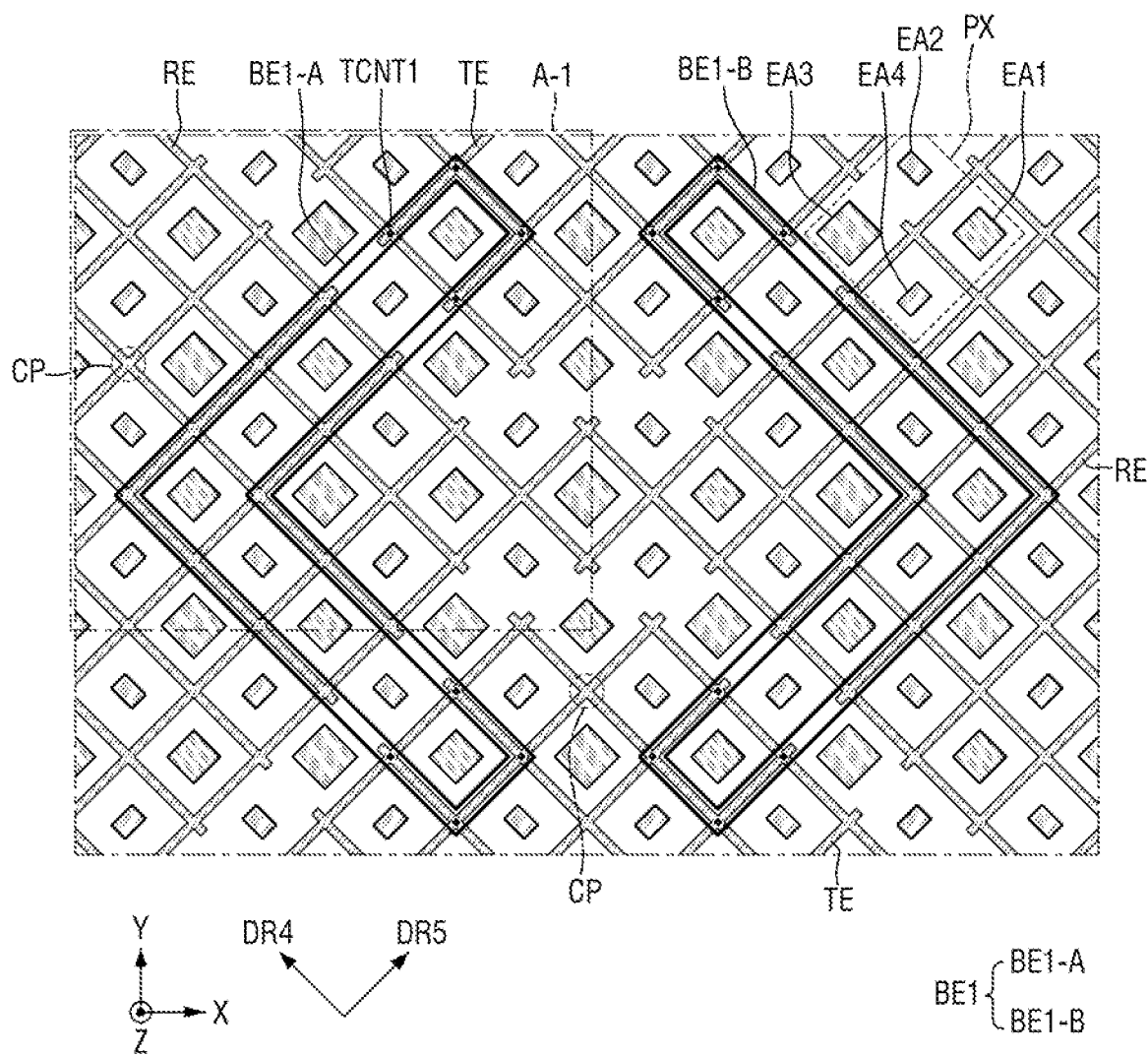
FIG. 5 is an enlarged plan view specifically illustrating an example of the area A of FIG. 4 according to the present invention.

The driving electrodes TE may be arranged in the first direction (X-axis direction) and the second direction (Y-axis direction) to form a plurality of columns and rows. The driving electrodes TE in each row which are adjacent to each other in the first direction (X-axis direction) may be electrically separated from each other. The driving electrodes TE in each column may be electrically connected to each other in the second direction (Y-axis direction). For example, the driving electrodes TE in each column which are adjacent to each other in the second direction (Y-axis direction) may be connected to each other through a connection electrode BE1 as shown in FIG. 5.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be disposed to be spaced apart from the driving electrode TE or the sensing electrode RE. Each of the dummy patterns DE may be electrically floating.

Although it is illustrated in FIG. 4 that each of the driving electrodes TE, the sensing electrodes RE, and the dummy patterns DE has a rhombic planar shape, but the shape thereof is not limited thereto. For example, each of the driving electrodes TE, the sensing electrodes RE, and the dummy patterns DE may have a planar shape of a rectangle other than a rhombus, a polygon other than a rectangle, a circle, or an ellipse.

The sensor lines TL1, TL2, and RL may be arranged in the sensor peripheral area TPA. The sensor lines TL1, TL2, and RL include sensing lines RL connected to the sensing electrodes RE, and first driving lines TL1 and second driving lines TL2 connected to the driving electrodes TE.

The sensing electrodes RE arranged at one side of the touch sensor area TSA may be connected to the sensing lines RL in a one-to-one manner. For example, as shown in FIG. 4, among the sensing electrodes RE electrically connected in the first direction (X-axis direction), the sensing electrode RE disposed at the right end may be connected to the sensing line RL. The sensing lines RL may be connected to second sensor pads TP2 in a one-to-one manner. Therefore, the touch driving circuit 400 may be electrically connected to the sensing electrodes RE.

The driving electrodes TE arranged at one side of the touch sensor area TSA may be connected to the first driving lines TL1 in a one-to-one manner, and the driving electrodes TE arranged at the other side of the touch sensor area TSA may be connected to the second driving lines TL2 in a one-to-one manner. For example, as shown in FIG. 4, among the driving electrodes TE electrically connected in the second direction (Y-axis direction), the driving electrodes RE disposed at the upper end may be connected to the first driving line TL1, and the driving electrodes RE disposed at the lower end may be connected to the second driving line TL2. The second driving lines TL2 may be connected to the driving electrodes TE at the upper side of the touch sensor area TSA via the outer left side of the touch sensor area TSA.

The first driving lines TL1 and the second driving lines TL2 may be connected to the first sensor pads TP1 in a one-to-one manner. Therefore, the touch driving circuit 400 may be electrically connected to the driving electrodes TE. Since the driving electrodes TE are connected to the driving lines TL1 and TL2 at opposite sides of the touch sensor area TSA to receive a touch driving signal, it is possible to prevent the occurrence of a difference between the touch driving signal applied to the driving electrodes TE disposed under the touch sensor area TSA and the touch driving signal applied to the driving electrodes TE disposed on the touch sensor area TSA due to the RC delay of the touch driving signal.

The first sensor pad area TPA1 in which the first sensor pads TP1 are disposed may be disposed at one side of the display pad area DPA in which the display pads DP are disposed. The second sensor pad area TPA2 in which the second sensor pads TP2 are disposed may be disposed at the other side of the display pad area DPA. The display pads DP may be electrically connected to data lines of the display panel 100.

The display pad area DPA, the first sensor pad area TPA1, and the second sensor pad area TPA2 may correspond to the pads of the display panel 100 connected to the display circuit board 300 as shown in FIG. 2. The display circuit board 300 may be disposed on the display pads DP, the first sensor pads TP1, and the second sensor pads TP2. The display pads DP, the first sensor pads TP1, and the second sensor pads TP2 may be electrically connected to the display circuit board 300 using a low-resistance and high-reliability material such as an anisotropic conductive film or a self-assembly anisotropic conductive paste (SAP). Therefore, the display pads DP, the first sensor pads TP1, and the second sensor pads TP2 may be electrically connected to the touch driving circuit 400 disposed on the display circuit board 300.

FIG. 5 is an enlarged plan view specifically illustrating an example of the area A of FIG. 4.

Referring to FIG. 5, since the driving electrodes TE and the sensing electrodes RE are disposed on the same layer, they may be disposed to be spaced apart from each other. A gap may be formed between the driving electrode TE and the sensing electrode RE adjacent to each other.

The dummy pattern DE may also be disposed on the same layer as the driving electrodes TE and the sensing electrodes RE. A gap may be formed between the driving electrode TE and the dummy pattern DE adjacent to each other and between the sensing electrode RE and the dummy pattern DE adjacent to each other.

The connection electrodes BE1 may be disposed on a different layer from the driving electrodes TE and the sensing electrodes RE. The connection electrode BE1 may be formed to be bent at least once. Although it is illustrated in FIG. 5 that the connection electrode BE1 has a bracket shape ("<" or ">"), the planar shape of the connection electrode BE1 is not limited thereto. Since the driving electrodes TE adjacent to each other in the second direction (Y-axis direction) are connected by the plurality of connection electrodes BE1, the driving electrodes TE adjacent to each other in the second direction (Y-axis direction) may be stably connected even if any one of the connection electrodes BE1 is disconnected. As illustrated in FIG. 5, the driving electrodes TE adjacent to each other are connected by the two connection electrodes BE1 including a first connection electrode BE1-A and a second connection electrode BE1-B. The number of connection electrodes BE1 is not limited thereto. For example, the number of connection electrodes BE1 may be at least three.

The first connection electrode BE1-A may overlap the driving electrodes TE adjacent in the second direction (Y-axis direction) in the third direction (Z-axis direction) that is the thickness direction of the substrate SUB. The first connection electrode BE1-A may overlap the sensing electrode RE in the third direction (Z-axis direction). A first end portion of the first connection electrode BE1-A may be connected to any one of the driving electrodes TE adjacent in the second direction (Y-axis direction) through a first touch contact hole TCNT1. The first touch contact hole TCNT1 may be provided in plural (e.g., four). The other end portion of the first connection electrode BE1-A may be connected to another driving electrode TE of the driving electrodes TE adjacent in the second direction (Y-axis direction) through a second touch contact hole TCNT1 which is spaced apart from the first touch contact hole TCNT1 in the second direction (Y-axis direction). The second touch contact hole TCNT1 may be provided in plural (e.g., four). The number of the plurality of first and second touch contact holes TCNT1 is not limited thereto. For example, the number of the plurality of first and second touch contact holes TCNT1 may be less than four or more than four. The above description of the first connection electrode BE1-A may be applicable to the second connection electrode BE1-B, and thus detailed description thereof will be omitted.

Due to the connection electrodes BE1 being located at a different layer from the driving electrodes TE and the sensing electrodes RE, the driving electrodes TE and the sensing electrodes RE may be electrically separated at their intersections. Accordingly, mutual capacitance may be formed between the driving electrodes TE and the sensing electrodes RE.

Each of the driving electrodes TE, the sensing electrodes RE, and the connection electrodes BE1 may have a planar shape of a mesh structure or a network structure. Each of the dummy patterns DE may have a planar shape of a mesh structure or a network structure. Accordingly, the driving electrodes TE, the sensing electrodes RE, the connection electrodes BE1, and the dummy patterns DE do not overlap light emitting units EA1, EA2, EA3, and EA4 of each of the pixels PX. Therefore, most light emitted from the light emitting units EA1, EA2, EA3, and EA4 may travel to the outside without passing through or being reflected from the driving electrodes TE, the sensing electrodes RE, the connection electrodes BE1, and the dummy patterns DE, thereby preventing the reduction in luminance of light.

Each of the pixels PX includes a first light emitting unit EA1 that emits light of a first color, a second light emitting unit EA2 that emits light of a second color, a third light emitting unit EA3 that emits light of a third color, and a fourth light emitting unit EA4 that emits light of the second color. For example, the first color may be red, the second color may be green, and the third color may be blue.

In each of the pixels PX, the first light emitting unit EA1 and the second light emitting unit EA2 may be adjacent to each other in the fourth direction DR4, and the third light emitting unit EA3 and the fourth light emitting unit EA4 may be adjacent to each other in the fourth direction DR4. In each of the pixels PX, the first light emitting unit EA1 and the fourth light emitting unit EA4 may be adjacent to each other in the fifth direction DR5, and the second light emitting unit EA2 and the third light emitting unit EA3 may be adjacent to each other in the fifth direction DR5.

Each of the first light emitting unit EA1, the second light emitting unit EA2, the third light emitting unit EA3, and the fourth light emitting unit EA4 may have a rhombus planar shape or a rectangular planar shape, but the shape thereof is not limited thereto. Each of the first light emitting unit EA1, the second light emitting unit EA2, the third light emitting unit EA3, and the fourth light emitting unit EA4 may have a planar shape of a polygon other than a rectangle, a circle, or an ellipse. Although it is illustrated in FIG. 5 that the area of the third light emitting unit EA3 is the largest, and each of the area of the second light emitting unit EA2 and the fourth light emitting unit EA4 is the smallest, the present invention is not limited thereto.

The second light emitting units EA2 and the fourth light emitting units EA4 may be arranged in the same rows (e.g., odd-numbered rows when rows are counted from the bottom). The second light emitting units EA2 and the fourth light emitting units EA4 may be arranged in parallel to each other in the first direction (X-axis direction) in each of the odd-numbered rows. The second light emitting units EA2 and the fourth light emitting units EA4 may be arranged alternately in each of the odd-numbered rows. Each of the second light emitting units EA2 may have short sides extending in the fourth direction DR4 and long sides extending in the fifth direction DR5, whereas each of the fourth light emitting units EA4 may have long sides extending in the fourth direction DR4 and short sides extending in the fifth direction DR5. The fourth direction DR4, which is a direction between the first direction (X-axis direction) and the second direction (Y-axis direction), may be a direction inclined by 45° with respect to the first direction (X-axis direction). The fifth direction DR5 may be a direction orthogonal to the fourth direction DR4.

The first light emitting units EA1 and the third light emitting units EA3 may be arranged in the same rows (e.g., even-numbered rows when rows are counted from the bottom). The first light emitting units EA1 and the third light emitting units EA3 may be arranged in parallel to each other in the first direction (X-axis direction) in each of the even-numbered rows. The first light emitting units EA1 and the third light emitting units EA3 may be arranged alternately in each of the even-numbered rows.

The second light emitting units EA2 and the fourth light emitting units EA4 may be arranged in odd-numbered rows. The second light emitting units EA2 and the fourth light emitting units EA4 may be arranged in parallel to each other in the second direction (Y-axis direction) in each of the odd-numbered rows. The second light emitting units EA2 and the fourth light emitting units EA4 may be arranged alternately in each of the odd-numbered rows.

The first light emitting units EA1 and the third light emitting units EA3 may be arranged in even-numbered rows. The first light emitting units EA1 and the third light emitting units EA3 may be arranged in parallel to each other in the second direction (Y-axis direction) in each of the even-numbered rows. The first light emitting units EA1 and the third light emitting units EA3 may be arranged alternately in each of the even-numbered rows.

Figure 6:
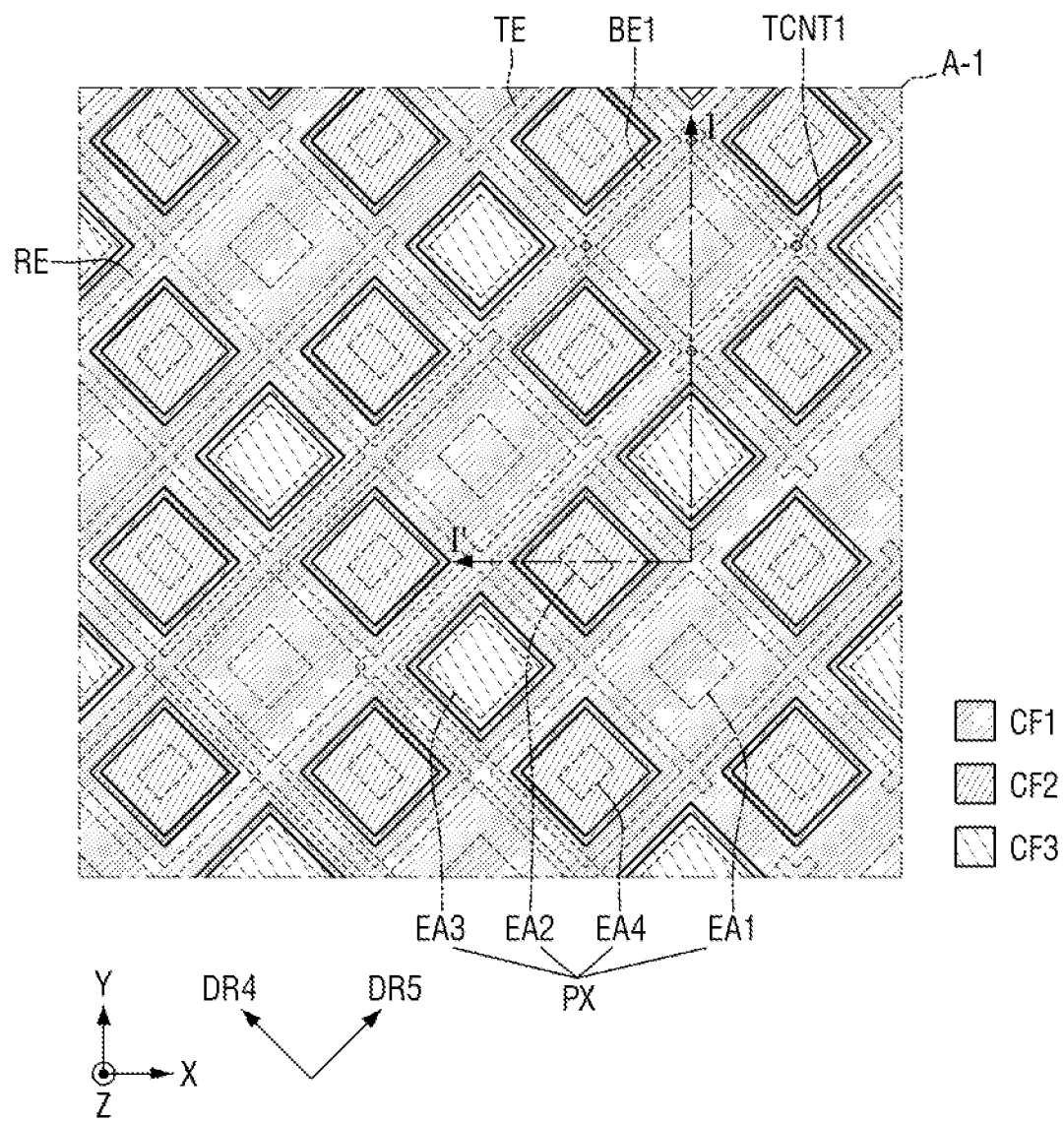
FIG. 6 is an enlarged plan view specifically illustrating an example of the area A-1 of FIG. 5 according to the present invention.

FIG. 6 is an enlarged plan view specifically illustrating an example of the area A-1 of FIG. 5.

In FIG. 6, for convenience of description, the driving electrode TE, the sensing electrode RE, the connection electrode BEL the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

Referring to FIG. 6, the first color filter CF1 may overlap the first light emitting unit EA1 in the third direction (Z-axis direction). The first color filter CF1 may not overlap the second light emitting unit EA2, the third light emitting unit EA3, and the fourth light emitting unit EA4 in the third direction (Z-axis direction). Thus, the first light emitted from the first light emitting unit EA1 may be output through the first color filter CF1.

The second color filter CF2 may overlap the second light emitting unit EA2 and the fourth light emitting unit EA4 in the third direction (Z-axis direction). The second color filter CF2 may not overlap the first light emitting unit EA1 and the third light emitting unit EA3 in the third direction (Z-axis direction). Thus, the second light emitted from the second light emitting unit EA2 and the fourth light emitting unit EA4 may be output through the second color filter CF2.

The third color filter CF3 may overlap the third light emitting unit EA3 in the third direction (Z-axis direction). The third color filter CF3 may not overlap the first light emitting unit EA1, the second light emitting unit EA2, and the fourth light emitting unit EA4 in the third direction (Z-axis direction). Thus, the third light emitted from the third light emitting unit EA3 may be output through the third color filter CF3.

Since the driving electrode TE, the sensing electrode RE, and the connection electrode BE1 have a planar shape of a mesh structure or a network structure, they may be disposed to surround the first light emitting unit EA1, the second light emitting unit EA2, the third light emitting unit EA3 and the fourth light emitting unit EA4. However, the driving electrode TE, the sensing electrode RE, and the connection electrode BE1 may not be disposed to surround the first light emitting unit EA1, the second light emitting unit EA2, the third light emitting unit EA3 and the fourth light emitting unit EA4 at the boundary between the driving electrode TE and the sensing electrode RE, the boundary between the driving electrode TE and the dummy pattern DE, and the boundary between the sensing electrode RE and the dummy pattern DE.

The first color filter CF1 may overlap the driving electrode TE, the sensing electrode RE, and the connection electrode BE1 in the third direction (Z-axis direction). For example, the first color filter CF1 may overlap the driving electrode TE, the sensing electrode RE, and the connection electrode BE1 disposed between the first light emitting unit EA1 and the second light emitting unit EA2, between the second light emitting unit EA2 and the third light emitting unit EA3, between the third light emitting unit EA3 and the fourth light emitting unit EA4, and between the first light emitting unit EA1 and the fourth light emitting unit EA4 in the third direction (Z-axis direction). The first color filter CF1 may be commonly disposed on the first light emitting units EA1.

Each of the second color filter CF2 and the third color filter CF3 does not overlap the driving electrode TE, the sensing electrode RE, and the connection electrode BE1 in the third direction (Z-axis direction). Each of the second color filter CF2 and the third color filter CF3 may have an island shape from a plan view. For example, the second color filters CF2 disposed on the second light emitting units EA2 adjacent to each other in the fourth direction DR4 and the fifth direction DR5 may be disposed apart from each other. The third color filters CF3 disposed on the third light emitting units EA3 adjacent to each other in the fourth direction DR4 and the fifth direction DR5 may be disposed apart from each other.

The driving electrodes TE may have crossing portions CP which are surrounded by the first light emitting unit EA1, the second light emitting unit EA2, and the third light emitting unit EA3, and the fourth light emitting unit EA4. For example, each crossing portion CP of the driving electrodes TE may disposed between the first light emitting unit EA1 and the third light emitting unit EA3 which are spaced apart from each other in a first direction X, and between the second light emitting unit EA2 and the fourth light emitting unit EA4 which are spaced apart from each other in a second direction Y. The sensing electrodes RE may have crossing portions CP which are surrounded by the first light emitting unit EA1, the second light emitting unit EA2, and the third light emitting unit EA3, and the fourth light emitting unit EA4. For example, each crossing portion CP of the sensing electrodes RE may be disposed between the first light emitting unit EA1 and the third light emitting unit EA3 which are spaced apart from each other in the first direction, and between the second light emitting unit EA2 and the fourth light emitting unit EA4 which are spaced apart from each other in the second direction Y.

The first color filter CF1 may overlap the crossing portion CP of the driving electrode TE and the crossing portion CP of the sensing electrode RE in the third direction (Z-axis direction). Each of the second color filter CF2 and the third color filter CF3 may not overlap the crossing portion CP of the driving electrode TE and the crossing portion CP of the sensing electrode RE in the third direction (Z-axis direction).

The overlapping region of the first color filter CF1 and the second color filter CF2 in the third direction (Z-axis direction) may be disposed to surround the second light emitting unit EA2 or the fourth light emitting unit EA4. The overlapping region of the first color filter CF1 and the second color filter CF2 in the third direction (Z-axis direction) may be surrounded by the driving electrode TE or the sensing electrode RE.

The overlapping region of the first color filter CF1 and the third color filter CF3 in the third direction (Z-axis direction) may be disposed to surround the third light emitting unit EA3. The overlapping region of the first color filter CF1 and the third color filter CF3 in the third direction (Z-axis direction) may be surrounded by the driving electrode TE or the sensing electrode RE.

The overlapping region of the first color filter CF1 and the second color filter CF2 in the third direction (Z-axis direction) and the overlapping region of the first color filter CF1 and the third color filter CF3 in the third direction (Z-axis direction) may not overlap the driving electrode TE, the sensing electrode RE, and the connection electrode BE1 in the third direction (Z-axis direction).

The color filter layer CFL (see, FIG. 3) does not include a black matrix. Conventionally, the black matrix overlaps the driving electrode TE and the sensing electrode RE in the third direction (Z-axis direction). Conventionally, the black matrix overlaps the driving electrode TE and the sensing electrode RE in the third direction (Z-axis direction). Thus, external light is reflected from the driving electrode TE and the sensing electrode RE, thereby preventing the driving electrode TE and the sensing electrode RE from being visually recognized from the front surface of the display device 10 by the user.

Figure 8:
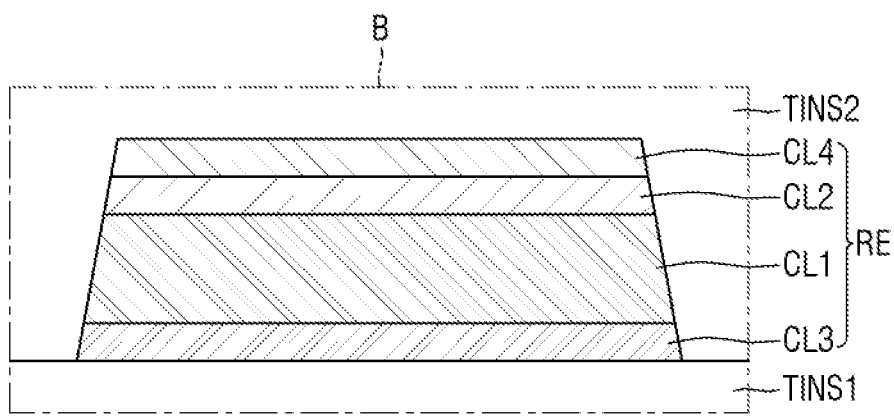
FIG. 8 is a cross-sectional view illustrating an example of the sensing electrode of FIG. 7 according to the present invention.

In an embodiment, the color filter layer CFL is formed without including a black matrix, and the driving electrode TE and the sensing electrode RE include a second conductive layer serving as a low-reflective layer (CL2 in FIG. 8). Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

A description of the low-reflective layer of the driving electrode TE and the sensing electrode RE will be described later with reference to FIGS. 8 to 13.

Figure 7:
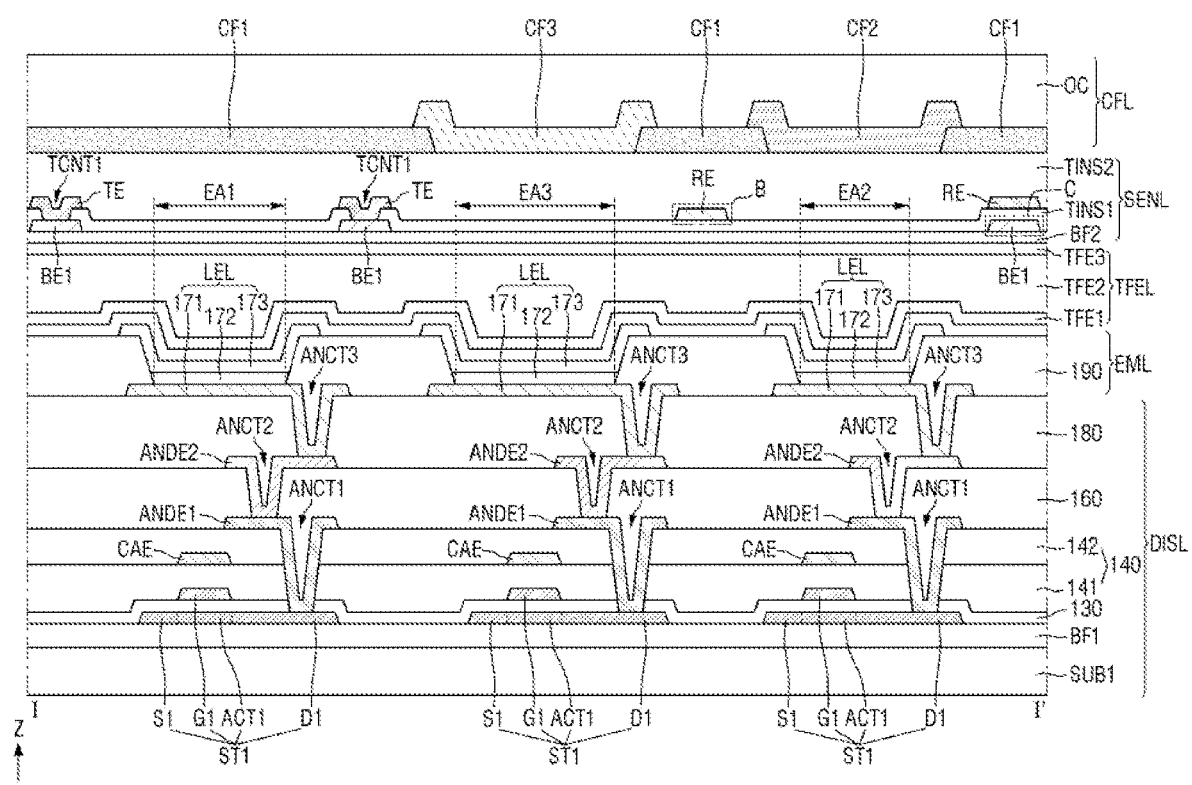
FIG. 7 is a cross-sectional view illustrating an example of a display panel taken along the line I-I' of FIG. 6 according to the present invention.

FIG. 7 is a cross-sectional view illustrating an example of a display panel taken along the line I-I' of FIG. 6.

Referring to FIG. 7, a first buffer layer BF1 may be disposed on a substrate SUB. The substrate SUB may be made of an insulating material such as a polymer resin. For example, the substrate SUB may be made of polyimide. The substrate SUB may be a flexible substrate capable of bending, folding, or rolling.

The first buffer layer BF1 is a layer for protecting transistors of a thin film transistor layer TFTL and a light emitting layer 172 of a light emitting element layer EML from moisture penetrating through the substrate SUB vulnerable to moisture permeation. The first buffer layer BF1 may be formed of a plurality of inorganic material layers that are alternately stacked. For example, the first buffer layer BF1 may be formed as a multilayer in which one or more inorganic material layers of a silicon nitride layer, a silicon oxy nitride layer, a silicon oxide layer, a titanium oxide layer, and an aluminum oxide layer are alternately stacked.

A transistor ST1 may be disposed on the first buffer layer BF1. The transistor ST1 includes an active layer ACT1, a gate electrode G1, a source electrode S1, and a drain electrode D1.

The active layer ACT1, the source electrode S1, and the drain electrode D1 of the transistor ST1 may be disposed on the first buffer layer BF1. The active layer ACT1 of the transistor ST1 includes polycrystalline silicon, single crystal silicon, low-temperature polycrystalline silicon, amorphous silicon, or an oxide semiconductor. The active layer ACT1 overlapping the gate electrode G1 in the third direction (Z-axis direction) that is a thickness direction of the substrate SUB may be defined as a channel region. The source electrode S1 and the drain electrode D1 are regions that do not overlap the gate electrode G1 in the third direction (Z-axis direction), and may have conductivity by doping a silicon semiconductor or an oxide semiconductor with ions or impurities.

A gate insulating layer 130 may be disposed on the active layer ACT1, the source electrode S1, and the drain electrode D1 of the transistor ST1. The gate insulating layer 130 may be formed of an inorganic material layer, for example, a silicon nitride layer, a silicon oxy nitride layer, a silicon oxide layer, a titanium oxide layer, or an aluminum oxide layer.

A gate electrode G1 of the transistor ST1 may be disposed on the gate insulating layer 130. The gate electrode G1 may overlap the active layer ACT1 in the third direction (Z-axis direction). The gate electrode G1 may be formed of a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first interlayer insulating layer 141 may be disposed on the gate electrode G1 of the transistor ST1. The first interlayer insulating layer 141 may be formed of an inorganic material layer, for example, a silicon nitride layer, a silicon oxy nitride layer, a silicon oxide layer, a titanium oxide layer, or an aluminum oxide layer. The first interlayer insulating layer 141 may be formed of a plurality of inorganic material layers.

A capacitor electrode CAE may be disposed on the first interlayer insulating layer 141. The capacitor electrode CAE may overlap the gate electrode G1 of the first transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 disposed therebetween. The capacitor electrode CAE may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second interlayer insulating layer 142 may be disposed on the capacitor electrode CAE. The second interlayer insulating layer 142 may be formed of an inorganic material layer, for example, a silicon nitride layer, a silicon oxy nitride layer, a silicon oxide layer, a titanium oxide layer, or an aluminum oxide layer. The second interlayer insulating layer 142 may be formed of a plurality of inorganic material layers.

A first anode connection electrode ANDE1 may be disposed on the second interlayer insulating layer 142. The first anode connection electrode ANDE1 may be connected to the drain electrode D1 of the transistor ST1 through a first connection contact hole ANCT1 penetrating the gate insulating layer 130, the first interlayer insulating layer 141, and the second interlayer insulating layer 142. The first anode connection electrode ANDE1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A first planarization layer 160 for flattening a step due to the transistor ST1 may be disposed on the first anode connection electrode ANDE1. The first planarization layer 160 may be formed of an organic layer including acrylic resin, epoxy resin, phenolic resin, polyamide resin, or polyimide resin.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

A second planarization layer 180 may be disposed on the second anode connection electrode ANDE2. The second planarization layer 180 may be formed of an organic layer including acrylic resin, epoxy resin, phenolic resin, polyamide resin, or polyimide resin.

Light emitting elements LEL and a bank 190 may be disposed on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating the second planarization layer 180.

In a top emission structure in which light is emitted toward the common electrode 173 from the light emitting layer 172, the pixel electrode 171 is formed of a high-reflectivity metal material such as a laminated structure (Ti/Al/Ti) of aluminum and titanium, a laminated structure (ITO/Al/ITO) of aluminum and indium tin oxide (ITO), an APC alloy, or a laminated structure (ITO/APC/ITO) of APC alloy and ITO. The APC alloy is an alloy of silver (Ag), palladium (Pd), and copper (Cu).

The first light emitting unit EA1, the second light emitting unit EA2, the third light emitting unit EA3, and the fourth light emitting unit EA4 may be defined by the bank 190. The bank 190 may be formed to partition the pixel electrode 171 on the second planarization layer 180. The bank 190 may be disposed to cover the edge of the pixel electrode 171. The bank 190 may be formed of an organic film including an acrylic resin, an epoxy resin, a phenolic resin, a polyamide resin, or a polyimide resin.

Each of the first light emitting unit EA1, the second light emitting unit EA2, the third light emitting unit EA3, and the fourth light emitting unit EA4 indicates an area in which the pixel electrode 171, the light emitting layer 172, and the common electrode 173 are sequentially stacked, and thus holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 may include an organic material and emit light of a predetermined color. For example, the light emitting layer 172 includes a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer commonly in the first light emitting unit EA1, the second light emitting unit EA2, the third light emitting unit EA3, and the fourth light emitting unit EA4. A capping layer may be formed on the common electrode 173.

In the top emission layer, the common electrode 173 may be formed of a transparent metal material (TCO) such as ITO or IZO that can transmit light, or a semi-transmissive conductive material such as magnesium (Mg), silver (Ag), or an alloy of magnesium (Mg) and silver (Ag). When the common electrode 173 is formed of a semi-transmissive metal material, light emission efficiency may be increased due to micro cavities.

An encapsulation layer TFEL may be disposed on the common electrode 173. The encapsulation layer TFEL includes at least one inorganic material layer to prevent the penetration of oxygen or moisture into the light emitting element layer EML. In addition, the encapsulation layer TFEL includes at least one organic layer to protect the light emitting element layer EML from foreign matter such as dust. For example, the encapsulation layer TFEL includes a first inorganic encapsulation layer TFE1, an organic encapsulation layer TFE2, and a second inorganic encapsulation layer TFE3.

The first inorganic encapsulation layer TFE1 may be disposed on the common electrode 173, the organic encapsulation layer TFE2 may be disposed on the first in organic encapsulation layer TFE1, and the inorganic second encapsulation layer TFE3 may be disposed on the organic encapsulation layer TFE2. Each of the first inorganic encapsulation layer TFE1 and the inorganic second encapsulation layer TFE3 may be formed as a multilayer in which one or more inorganic material layers of silicon nitride layer, silicon oxy nitride layer, silicon oxide layer, titanium oxide layer, and aluminum oxide layer are alternately stacked. The encapsulation organic layer TFE2 may be an organic layer including an acrylic resin, an epoxy resin, a phenolic resin, a polyamide resin, or a polyimide resin.

A touch sensing layer SENL may be disposed on the encapsulation layer TFEL. The touch sensing layer SENL includes a second buffer layer BF2, a connection electrode BE1, a first touch insulating layer TINS1, a driving electrode TE, a sensing electrode RE, and a second touch insulating layer TINS2.

The second buffer layer BF2 may be formed of an inorganic material layer, for example, a silicon nitride layer, a silicon oxynitride layer, a silicon oxide layer, a titanium oxide layer, or an aluminum oxide layer.

Figure 9:
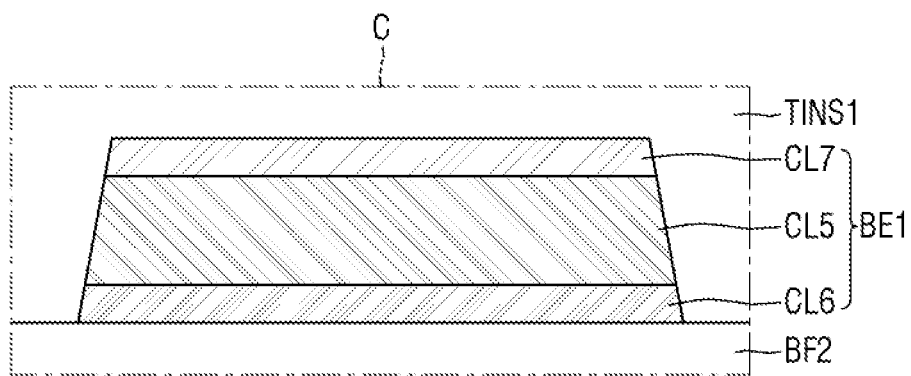
FIG. 9 is a cross-sectional view illustrating an example of the connection electrode of FIG. 7 according to the present invention.

The connection electrode BE1 may be disposed on the second buffer layer BF2. The connection electrode BE1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. For example, as shown in FIG. 9, the connection electrode BE1 includes a fifth conductive layer CL5, a sixth conductive layer CL6, and a seventh conductive layer CL7. A detailed description of the connection electrode BE1 will be described later with reference to FIG. 9.

The first touch insulating layer TINS1 is disposed on the connection electrode BE1. The first touch insulating layer TINS1 may be formed of an inorganic material layer, for example, a silicon nitride layer, a silicon oxynitride layer, a silicon oxide layer, a titanium oxide layer, or an aluminum oxide layer. Alternatively, the first touch insulating layer TINS1 may be an organic layer including an acrylic resin, an epoxy resin, a phenolic resin, a polyamide resin, or a polyimide resin.

The driving electrode TE and the sensing electrode RE may be disposed on the first touch insulating layer TINS1. In addition to the driving electrode TE and the sensing electrode RE, the dummy patterns DE, the first driving lines TL1, the second driving lines TL2, and the sensing lines RL, which are shown in FIG. 4, may be disposed on the first touch insulating layer TINS1.

The driving electrode TE and the sensing electrode RE may overlap the connection electrode BE1 in the third direction (Z-axis direction). The driving electrode TE may be connected to the connection electrode BE1 through a touch contact hole TCNT1 penetrating the first touch insulating layer TINS1. The sensing electrode RE may be separate from the connection electrode BE1 by the first touch insulating layer TINS1. Each of the driving electrode TE and the sensing electrode RE includes a low-reflective layer to reduce the reflection of light incident from the outside. For example, as shown in FIG. 8, each of the driving electrode TE and the sensing electrode RE includes a first conductive layer CL1, a second conductive layer CL2, a third conductive layer CL3, and a fourth conductive layer CL4. A detailed description of the driving electrode TE and the sensing electrode RE will be described later with reference to FIG. 8.

The second touch insulating layer TINS2 is formed on the driving electrode TE and the sensing electrode RE. The second touch insulating layer TINS2 may serve to flatten a step formed by the driving electrode TE, the sensing electrode RE, and the connection electrode BE1. The second touch insulating layer TINS2 may be an organic layer including an acrylic resin, an epoxy resin, a phenolic resin, a polyamide resin, or a polyimide resin.

A color filter layer CFL may be disposed on the touch sensing layer SENL. The color filter layer CFL may include a first color filter CF1, a second color filter CF2, and a third color filter CF3.

The first color filter CF1 may transmit light of a first wavelength range, and may overlap the first light emitting unit EA1 in the third direction (Z-axis direction). The first light emitting unit EA1 may emit light of a first color corresponding to the light of the first wavelength range. The first wavelength range may be about 600 nm to about 750 nm.

The first color filter CF1 may overlap the driving electrode TE and the sensing electrode RE in the third direction (Z-axis direction). The first color filter CF1 may overlap the connection electrode BE1 in the third direction (Z-axis direction). The first color filter CF1 may overlap the touch contact hole TCNT1 in the third direction (Z-axis direction).

The second color filter CF2 may transmit light of a second wavelength range, and may overlap the second light emitting unit EA2 in the third direction (Z-axis direction). The second light emitting unit EA2 may emit light of a second color corresponding to the light of the second wavelength range. The second wavelength range may be about 480 nm to about 560 nm. Terms such as "about" and the like mean "within a small percentage of" as understood by persons of ordinary skill in the art in the pertinent art.

The second color filter CF2 may not overlap the driving electrode TE and the sensing electrode RE in the third direction (Z-axis direction). The second color filter CF2 may not overlap the connection electrode BE1 in the third direction (Z-axis direction). The second color filter CF2 may not overlap the touch contact hole TCNT1 in the third direction (Z-axis direction).

The third color filter CF3 may transmit light of a third wavelength range, and may overlap the third light emitting unit EA3 in the third direction (Z-axis direction). The third light emitting unit EA3 may emit light of a third color corresponding to the light of the third wavelength range. The third wavelength range may be about 370 nm to about 460 nm.

The third color filter CF3 may not overlap the driving electrode TE and the sensing electrode RE in the third direction (Z-axis direction). The third color filter CF3 may not overlap the connection electrode BE1 in the third direction (Z-axis direction). The third color filter CF3 may not overlap the touch contact hole TCNT1 in the third direction (Z-axis direction).

The overlapping region of the first color filter CF1 and the second color filter CF2 in the third direction (Z-axis direction), and the overlapping region of the first color filter CF1 and the third color filter CF3 in the third direction (Z-axis direction) may not overlap the driving electrode TE, the sensing electrode RE, and the connection electrode BE1 in the third direction (Z-axis direction). Terms such as "first," "second," and the like, are used to describe various elements, regions, sections, etc., and are not intended to be limiting.

Since the second color filter CF2 and the third color filter CF3 are disposed on the first color filter CF1 as shown in FIG. 7, after the first color filter CF1 is formed on the touch sensing layer SENL, any one of the second color filter CF2 and the third color filter CF3 may be formed, and then the other one of the second color filter CF2 and the third color filter CF3 may be formed. However, embodiments of the present specification are not limited thereto.

For example, the first color filter CF1 may be disposed on any one of the second color filter CF2 and the third color filter CF3, and the other one of the second color filter CF2 and the third color filter CF3 may be disposed on the first color filter CF1. In this case, after any one of the second color filter CF2 and the third color filter CF3 is formed on the touch sensing layer SENL, the first color filter CF1 may be formed, and then the other one of the second color filter CF2 and the third color filter CF3 may be formed.

Alternatively, the first color filter CF1 may be disposed on the second color filter CF2 and the third color filter CF3. In this case, after any one of the second color filter CF2 and the third color filter CF3 is formed on the touch sensing layer SENL, the other one of the second color filter CF2 and the third color filter CF3 may be formed, and then the first color filter CF1 may be formed.

An overcoat layer OC for planarization may be disposed on the first color filter CF1, the second color filter CF2, and the third color filter CF3. The overcoat layer OC may be formed of an organic layer including an acrylic resin, an epoxy resin, a phenolic resin, a polyamide resin, or a polyimide resin.

As shown in FIG. 7, the color filter layer CFL may be formed without including a black matrix, and the driving electrode TE and the sensing electrode RE include a second conductive layer serving as a low-reflective layer (CL2 in FIG. 8). Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

FIG. 8 is a cross-sectional view illustrating an example of the sensing electrode of FIG. 7. FIG. 8 illustrates an enlarged cross-sectional view of the area B of FIG. 7.

Referring to FIG. 8, the sensing electrode RE includes a first conductive layer CL1, a second conductive layer CL2, a third conductive layer CL3, and a fourth conductive layer CL4.

The third conductive layer CL3 may be disposed on the first touch insulating layer TINS1, and the first conductive layer CL1 may be disposed on the third conductive layer CL3. The second conductive layer CL2 may be disposed on the first conductive layer CL1, and the fourth conductive layer CL4 may be disposed on the second conductive layer CL2.

The thickness of the first conductive layer CL1 may be greater than the thickness of the second conductive layer CL2, the thickness of the third conductive layer CL3, and the thickness of the fourth conductive layer CL4. For example, the thickness of the first conductive layer CL1 may be about 6,000 Å, the thickness of the second conductive layer CL2 may be about 10 to 3,000 Å, and the thickness of the third conductive layer CL3 may be about 10 to 300 Å.

The electrical conductivity of the first conductive layer CL1 may be higher than the electrical conductivity of the second conductive layer CL2, the electrical conductivity of the third conductive layer CL3, and the electrical conductivity of the fourth conductive layer CL4. The first conductive layer CL1 may be formed of any one of aluminum (Al), silver (Ag), and copper (Cu), or an alloy containing any one of aluminum (Al), silver (Ag), and copper (Cu).

The second conductive layer CL2 may be a low-reflective layer for reducing the reflection of light incident from the outside. The reflectance of the second conductive layer CL2 may be lower than the reflectance of the first conductive layer CL1, the reflectance of the third conductive layer CL3, and the reflectance of the fourth conductive layer CL4. The second conductive layer CL2 may include molybdenum (Mo), an alloy containing molybdenum (Mo), an oxide or nitride containing molybdenum (Mo), nickel (Ni), an alloy containing nickel (Ni), an oxide or nitride containing nickel (Ni), or an oxide or nitride containing aluminum (Al). In an embodiment, the second conductive layer CL2 includes or is formed of molybdenum tantalum oxide (MTO).

The third conductive layer CL3 may be made of a metal material having high adhesion to the first touch insulating layer TINS1 which is an inorganic material layer. For example, the third conductive layer CL3 may be formed of any one of titanium (Ti) and ITO. A conductive layer substantially the same as the third conductive layer CL3 may be added between the second conductive layer CL2 and the fourth conductive layer CL4.

The fourth conductive layer CL4 may be made of a transparent conductive oxide such as ITO having excellent corrosion resistance. The third conductive layer CL3 and the fourth conductive layer CL4 may be made of the same material. The fourth conductive layer CL4 may be omitted.

An example of the driving electrode TE of FIG. 7 may be substantially the same as the sensing electrode RE described with reference to FIG. 8.

As shown in FIG. 8, each of the driving electrode TE and the sensing electrode RE includes the second conductive layer CL2 having low reflectance. Thus, even when the color filter layer CFL does not include a black matrix, it is possible to prevent the driving electrode TE and the sensing electrode RE from being visually recognized by the user. Accordingly, since the color filter layer CFL does not include a black matrix, a mask process for preparing the black matrix may be omitted. Accordingly, the manufacturing costs of the color filter layer CFL may be reduced.

FIG. 9 is a cross-sectional view illustrating an example of the connection electrode of FIG. 7. FIG. 9 illustrates an enlarged cross-sectional view of the area C of FIG. 7.

Referring to FIG. 9, the connection electrode BE1 includes a fifth conductive layer CL5, a sixth conductive layer CL6, and a seventh conductive layer CL7.

The sixth conductive layer CL6 may be disposed on the second buffer layer BF2, and the fifth conductive layer CL5 may be disposed on the sixth conductive layer CL6. The seventh conductive layer CL7 may be disposed on the fifth conductive layer CL5.

The thickness of the fifth conductive layer CL5 may be greater than the thickness of the sixth conductive layer CL2 and the thickness of the seventh conductive layer CL7. The electrical conductivity of the fifth conductive layer CL5 may be higher than the electrical conductivity of the sixth conductive layer CL6 and the electrical conductivity of the seventh conductive layer CL7. The fifth conductive layer CL5 may be formed of any one of aluminum (Al), silver (Ag), and copper (Cu), or an alloy containing any one of aluminum (Al), silver (Ag), and copper (Cu). The fifth conductive layer CL5 may be made of the same material as the first conductive layer CL1 of the driving electrode TE and the sensing electrode RE.

The sixth conductive layer CL6 may be made of a metal material having high adhesion to the second buffer layer BF2 which is an inorganic material layer. For example, the sixth conductive layer CL6 may be formed of any one of titanium (Ti) and ITO. The sixth conductive layer CL6 may be made of the same material as the third conductive layer CL3.

The seventh conductive layer CL7 may be made of a metal material having excellent corrosion resistance. For example, the seventh conductive layer CL7 may be made of any one of titanium (Ti) and a transparent conductive oxide such as ITO. The seventh conductive layer CL7 may be made of the same material as the sixth conductive layer CL6.

Figure 10:
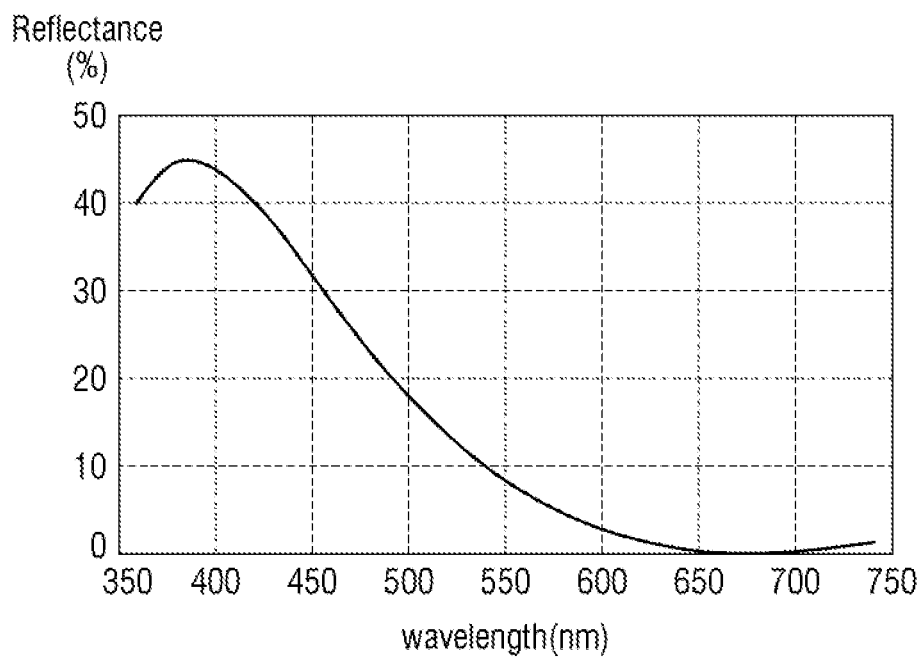
FIG. 10 is a graph illustrating a ratio of light reflected by a driving electrode and a sensing electrode for each wavelength of light according to the present invention.

FIG. 10 is a graph illustrating a ratio of light reflected by a driving electrode and a sensing electrode for each wavelength of light.

Referring to FIG. 10, X-axis indicates a wavelength of light, and Y-axis indicates reflectance. In FIG. 10, when the second conductive layer CL2 of the sensing electrode RE shown in FIG. 8 has a thickness of 550 Å and the fourth conductive layer CL4 shown in FIG. 8 has a thickness of 50 Å, the ratio of light reflected by sensing electrode RE for each wavelength of light is illustrated. FIG. 10 illustrates a case where the second conductive layer CL2 of the sensing electrode RE includes or is formed of (or made of) molybdenum tantalum oxide (MTO).

When the second conductive layer CL2 is made of molybdenum tantalum oxide (MTO), the ratio at which light having a wavelength of about 650 nm is reflected by the sensing electrode RE is the lowest, and the ratio at which light having a wavelength of about 380 nm is reflected by the sensing electrode RE is the highest. In particular, the ratio at which light having a wavelength of about 540 nm is reflected by the sensing electrode RE does not exceed 10%. In contrast, the ratio at which light having a wavelength of about 350 nm to 430 nm is reflected by the sensing electrode RE exceeds 40%, and the ratio at which light having a wavelength of about 430 nm to 460 nm is reflected by the sensing electrode RE exceeds 30%. The ratio at which light having a wavelength of about 460 nm to 490 nm is reflected by the sensing electrode RE exceeds 20%, and the ratio at which light having a wavelength of about 490 nm to 540 nm is reflected by the sensing electrode RE exceeds 10%.

As shown in FIG. 10, when the second conductive layer CL2 is made of molybdenum tantalum oxide (MTO), the reflectance of light having a wavelength of 540 nm or less (i.e., light in the blue wavelength range) is high, and thus it is necessary to prevent or reduce the light in the blue wavelength range from being visually recognized.

Figure 11:
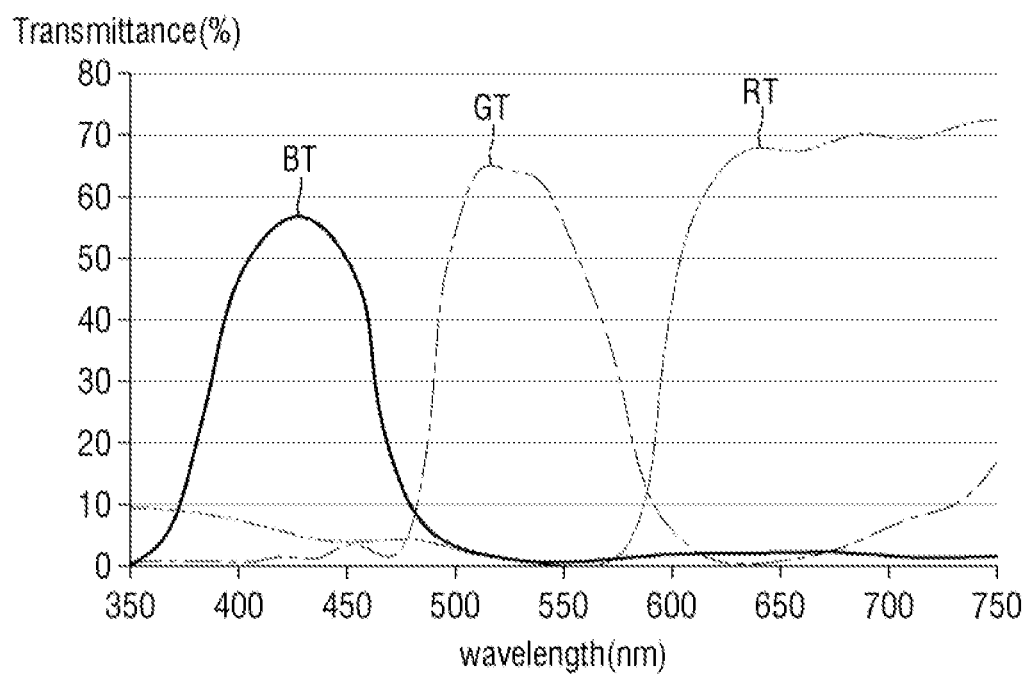
FIG. 11 is a graph showing light transmittance of a first color filter, a second color filter, and a third color filter for each wavelength of light according to the present invention.

FIG. 11 is a graph showing light transmittance of a first color filter, a second color filter, and a third color filter for each wavelength of light.

Referring to FIG. 11, X-axis indicates a wavelength of light and a Y-axis indicates transmittance.

The light transmittance RT of the first color filter CF1 may be 50% or more in a wavelength range of about 600 nm to 750 nm. The light transmittance of the first color filter CF1 may be lower than 10% in a wavelength range of about 350 nm to 570 nm. The first color filter CF1 may block most of light having a wavelength range of about 350 nm to 570 nm.

The light transmittance GT of the second color filter CF2 may be 50% or more in a wavelength range of about 480 nm to 560 nm. The light transmittance of the second color filter CF2 may be lower than 10% in a wavelength range of about 350 nm to 460 nm and a wavelength range of about 570 nm to 730 nm. The second color filter CF2 may block most of light having a wavelength range of about 350 nm to 460 nm and a wavelength range of about 570 nm to 730 nm.

The light transmittance BT of the third color filter CF3 may be 50% or more in a wavelength range of about 370 nm to 460 nm. The light transmittance of the second color filter CF2 may be lower than 10% in a wavelength range higher than about 460 nm. The third color filter CF3 may block most of light having a wavelength range higher than about 460 nm.

Even when the driving electrode TE and the sensing electrode RE include a second conductive layer CL2 serving as a low-reflective layer for reducing the reflection of light incident from the outside, the reflectance of the driving electrode TE and the sensing electrode RE with respect to the light in the blue wavelength range is about 10% or more, which is high, so that it is necessary to prevent or reduce the light in the blue wavelength range from being visually recognized from the outside.

The first color filter CF1 blocks most of the light having a wavelength range of about 350 nm to 570 nm, and the second color filter CF2 blocks most of the light having a wavelength range of about 350 nm to 460 nm. Therefore, when the driving electrode TE and the sensing electrode RE overlap at least one of the first color filter CF1 and the second color filter CF2 in the third direction (Z-axis direction), light reflected from the second conductive layer CL2 may be output to the outside to prevent or reduce the light from being visually recognized by the user.

For example, as shown in FIGS. 6 and 7, the first color filter CF1 overlaps the driving electrode TE and the sensing electrode RE in the third direction (Z-axis direction). Accordingly, the first color filter CF1 may block light in the blue wavelength range reflected from the second conductive layer CL2. Therefore, it is possible to prevent or reduce the light reflected from the second conductive layer CL2 of the driving electrode TE and the sensing electrode RE from being output to the outside and being visually recognized by the user.

Figure 12:
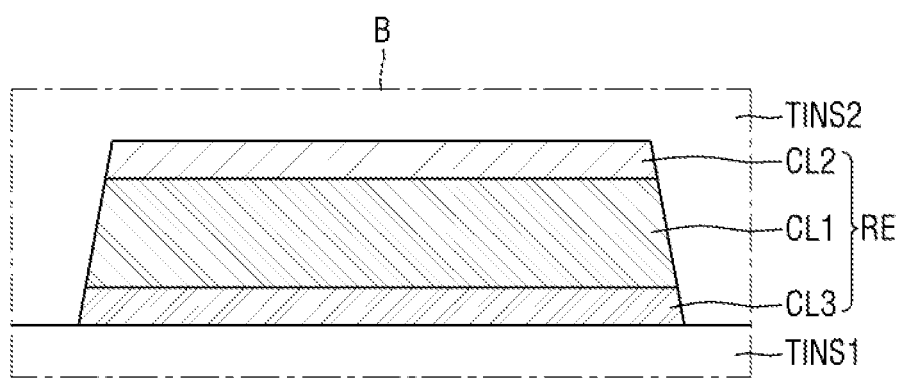
FIG. 12 is a cross-sectional view illustrating another example of the sensing electrode of FIG. 7 according to the present invention.

FIG. 12 is a cross-sectional view illustrating another example of the sensing electrode of FIG. 7. Since the embodiment of FIG. 12 is only different from the embodiment of FIG. 8 in that the fourth conductive layer CL4 of the sensing electrode RE is omitted, a description of the embodiment of FIG. 12 will be omitted.

Figure 13:
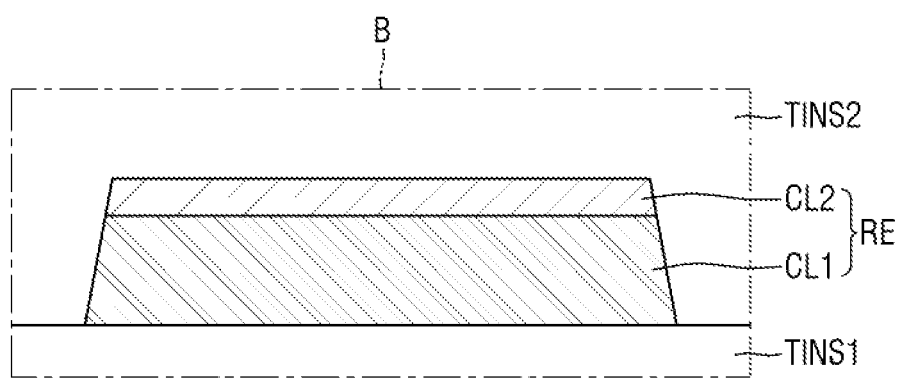
FIG. 13 is a cross-sectional view illustrating another example of the sensing electrode of FIG. 7 according to the present invention.

FIG. 13 is a cross-sectional view illustrating another example of the sensing electrode of FIG. 7. Since the embodiment of FIG. 13 is only different from the embodiment of FIG. 8 in that the third conductive layer CL3 and fourth conductive layer CL4 of the sensing electrode RE are omitted, a description of the embodiment of FIG. 13 will be omitted.

Figure 14:
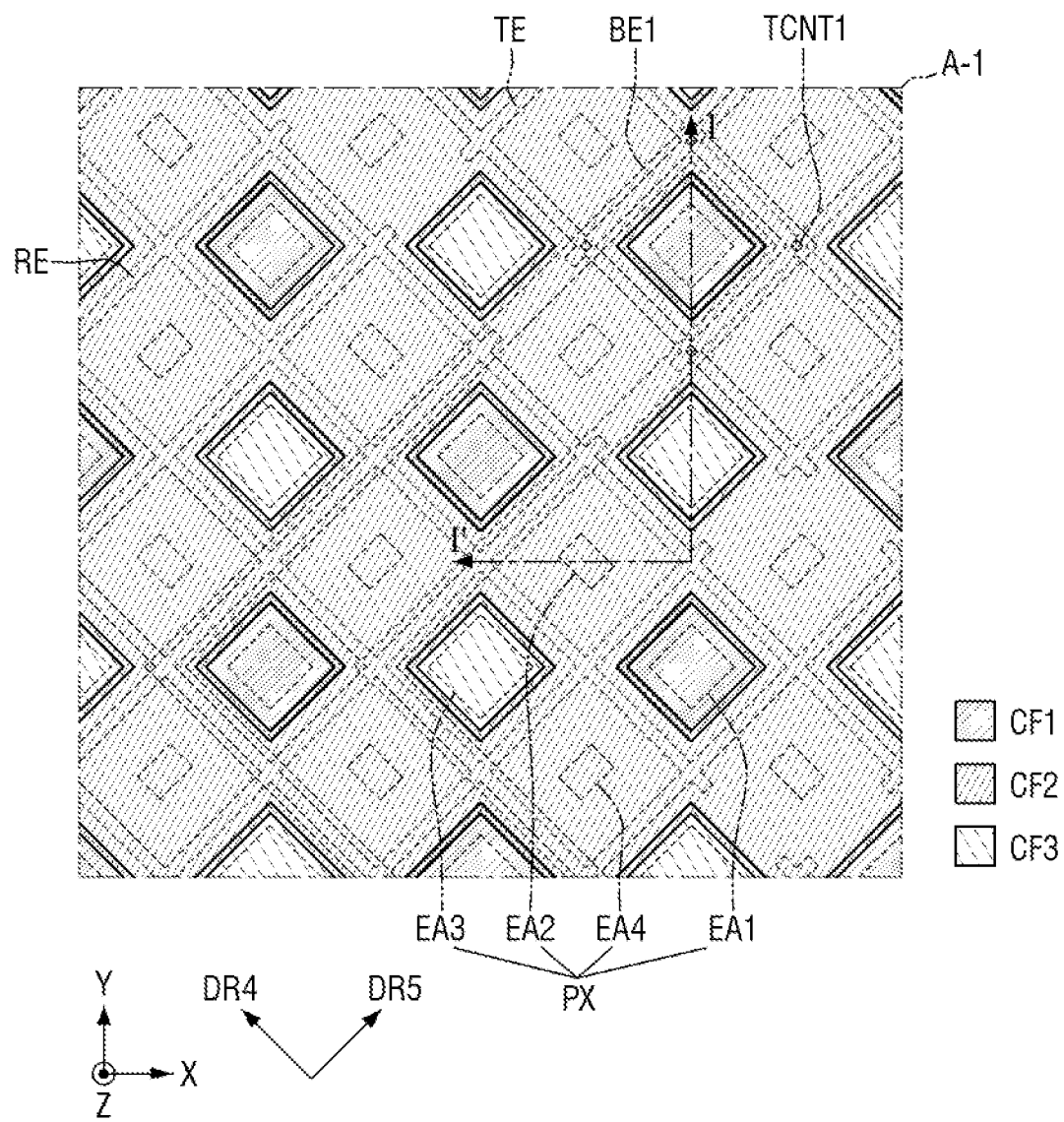
FIG. 14 is an enlarged plan view specifically illustrating another example of the area A-1 of FIG. 5 according to the present invention.

FIG. 14 is an enlarged plan view specifically illustrating another example of the area A-1 of FIG. 5.

In FIG. 14, for convenience of description, the driving electrode TE, the sensing electrode RE, the connection electrode BE1, the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

The embodiment of FIG. 14 is different from the embodiment of FIG. 6 in that instead of the first color filter CF1, the second color filter CF2 overlaps the driving electrode TE, the sensing electrode RE, and the connection electrode BE1 in the third direction (Z-axis direction). In FIG. 14, differences from the embodiment of FIG. 6 will be mainly described.

Referring to FIG. 14, the second color filter CF2 may overlap the driving electrode TE, the sensing electrode RE, and the connection electrode BE1 in the third direction (Z-axis direction). The second color filter CF2 may overlap the driving electrode TE, the sensing electrode RE, and the connection electrode BE1, which are respectively disposed between the first light emitting unit EA1 and the second light emitting unit EA2, between the second light emitting unit EA2 and the third light emitting unit EA3, between the third light emitting unit EA3 and the fourth light emitting unit EA4, and between the first light emitting unit EA1 and the fourth light emitting unit EA4, in the third direction (Z-axis direction). The second color filter CF2 may be commonly disposed on the second light emitting units EA2 and the fourth light emitting units EA4.

Each of the first color filter CF1 and third color filter CF3 does not overlap the driving electrode TE, the sensing electrode RE, and the connection electrode BE1 in the third direction (Z-axis direction). Each of the first color filter CF1 and the third color filter CF3 may have an island shape from a plan view. For example, the first color filters CF1 disposed on the first light emitting units EA1 adjacent to each other in the fourth direction DR4 and the fifth direction DR5 may be disposed apart from each other. The third color filters CF3 disposed on the third light emitting units EA3 adjacent to each other in the fourth direction DR4 and the fifth direction DR5 may be disposed apart from each other.

The second color filter CF2 may overlap the crossing portion CP of the driving electrode TE and the crossing portion CP of the sensing electrode RE in the third direction (Z-axis direction). Each of the first color filter CF1 and the third color filter CF3 may not overlap the crossing portion CP of the driving electrode TE and the crossing portion CP of the sensing electrode RE in the third direction (Z-axis direction). FIG. 5 shows where the crossing portions CP of the driving electrode TE and the crossing portions CP of the sensing electrode RE are located.

The overlapping region of the first color filter CF1 and the second color filter CF2 in the third direction (Z-axis direction) may be disposed to surround the first light emitting unit EA1. The overlapping region of the first color filter CF1 and the second color filter CF2 in the third direction (Z-axis direction) may be surrounded by the driving electrode TE or the sensing electrode RE.

The overlapping region of the second color filter CF2 and the third color filter CF3 in the third direction (Z-axis direction) may be disposed to surround the third light emitting unit EA3. The overlapping region of the first color filter CF1 and the third color filter CF3 in the third direction (Z-axis direction) may be surrounded by the driving electrode TE or the sensing electrode RE.

The overlapping region of the first color filter CF1 and the second color filter CF2 in the third direction (Z-axis direction) and the overlapping region of the second color filter CF2 and the third color filter CF3 in the third direction (Z-axis direction) may not overlap the driving electrode TE, the sensing electrode RE, and the connection electrode BE1 in the third direction (Z-axis direction).

Figure 15:
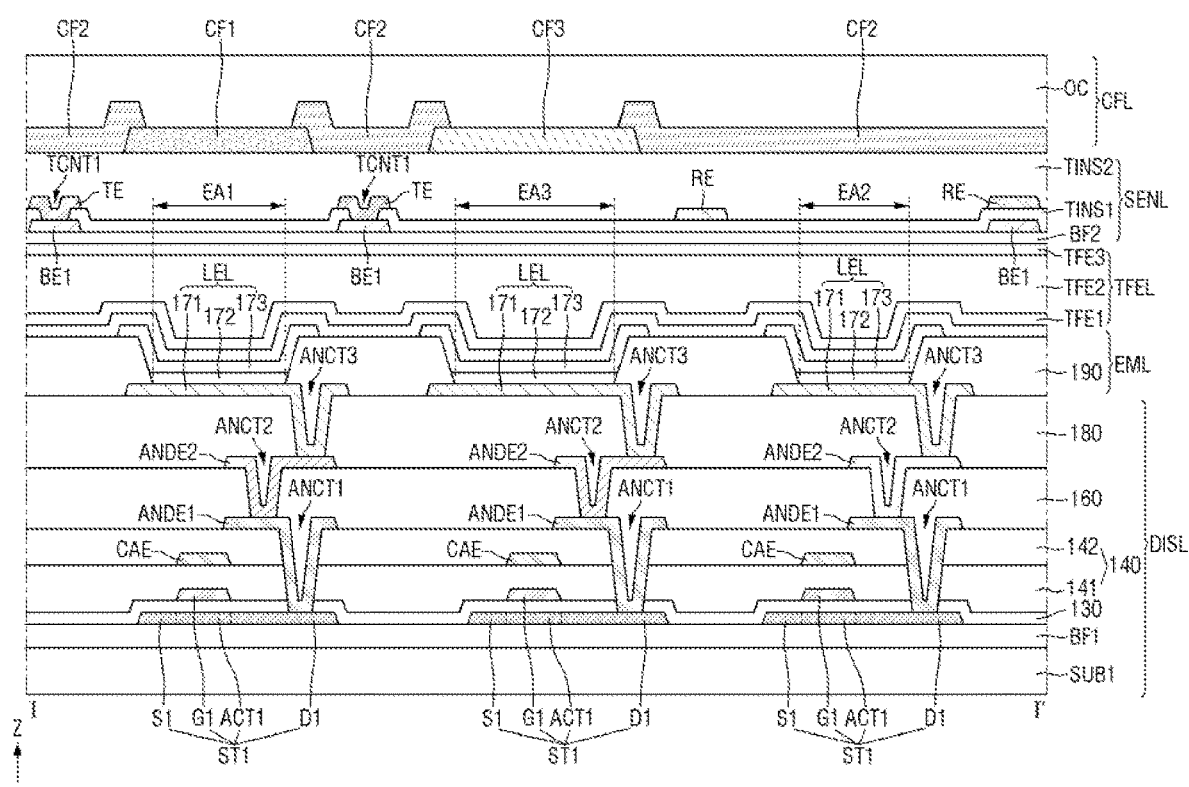
FIG. 15 is a cross-sectional view illustrating another example of a display panel taken along the line I-I' of FIG. 14 according to the present invention.

FIG. 15 is a cross-sectional view illustrating another example of a display panel taken along the line I-I' of FIG. 14.

The embodiment of FIG. 15 is different from the embodiment of FIG. 7 in that, instead of the first color CF1, the second color filter CF2 overlaps the driving electrode TE, the sensing electrode RE, and the connection electrode BE1 in the third direction (Z-axis direction). In FIG. 15, differences from the embodiment of FIG. 7 will be mainly described.

The first color filter CF1 may not overlap the driving electrode TE and the sensing electrode RE in the third direction (Z-axis direction). The first color filter CF1 may not overlap the connection electrode BE1 in the third direction (Z-axis direction). The first color filter CF1 may not overlap the touch contact hole TCNT1 in the third direction (Z-axis direction).

The second color filter CF2 may overlap the driving electrode TE and the sensing electrode RE in the third direction (Z-axis direction). The second color filter CF2 may overlap the connection electrode BE1 in the third direction (Z-axis direction). The second color filter CF2 may overlap the touch contact hole TCNT1 in the third direction (Z-axis direction).

The third color filter CF3 may not overlap the driving electrode TE and the sensing electrode RE in the third direction (Z-axis direction). The third color filter CF3 may not overlap the connection electrode BE1 in the third direction (Z-axis direction). The third color filter CF3 may not overlap the touch contact hole TCNT1 in the third direction (Z-axis direction).

The overlapping region of the first color filter CF1 and the second color filter CF2 in the third direction (Z-axis direction), and the overlapping region of the second color filter CF2 and the third color filter CF3 in the third direction (Z-axis direction) may overlap the driving electrode TE, the sensing electrode RE, and the connection electrode BE1 in the third direction (Z-axis direction).

Since the second color filter CF2 is disposed on the first color filter CF1 and the third color filter CF3 as shown in FIG. 15, after any one of the first color filter CF3 and the third color filter CF3 is formed on the touch sensing layer SENL, the other one of the first color filter CF3 and the third color filter CF3 may be formed, and then second color filter CF2 may be formed. However, embodiments of the present specification are not limited thereto.

For example, the second color filter CF2 may be disposed on any one of the first color filter CF1 and the third color filter CF3, and the other one of the first color filter CF1 and the third color filter CF3 may be disposed on the second color filter CF2. In this case, after any one of the first color filter CF1 and the third color filter CF3 is formed on the touch sensing layer SENL, the second color filter CF2 may be formed, and then the other one of the first color filter CF1 and the third color filter CF3 may be formed.

Alternatively, the first color filter CF1 and the third color filter CF3 may be disposed on the second color filter CF2. In this case, after the first color filter CF1 is formed on the touch sensing layer SENL, any one of the second color filter CF2 and the third color filter CF3 may be formed, and then the other one of the second color filter CF2 and the third color filter CF3 may be formed.

As shown in FIGS. 14 and 15, the color filter layer CFL may be formed without including a black matrix, and the driving electrode TE and the sensing electrode RE include a second conductive layer serving as a low-reflective layer CL2 as shown in FIG. 8. Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

As shown in FIGS. 14 and 15, the second color filter CF2 overlaps the driving electrode TE and the sensing electrode RE in the third direction (Z-axis direction). Accordingly, the second color filter CF2 may block light in the blue wavelength range reflected from the second conductive layer CL2. Therefore, it is possible to prevent or reduce the light reflected from the second conductive layer CL2 of the driving electrode TE and the sensing electrode RE from being output to the outside and thus being visually recognized by the user.

Figure 16:
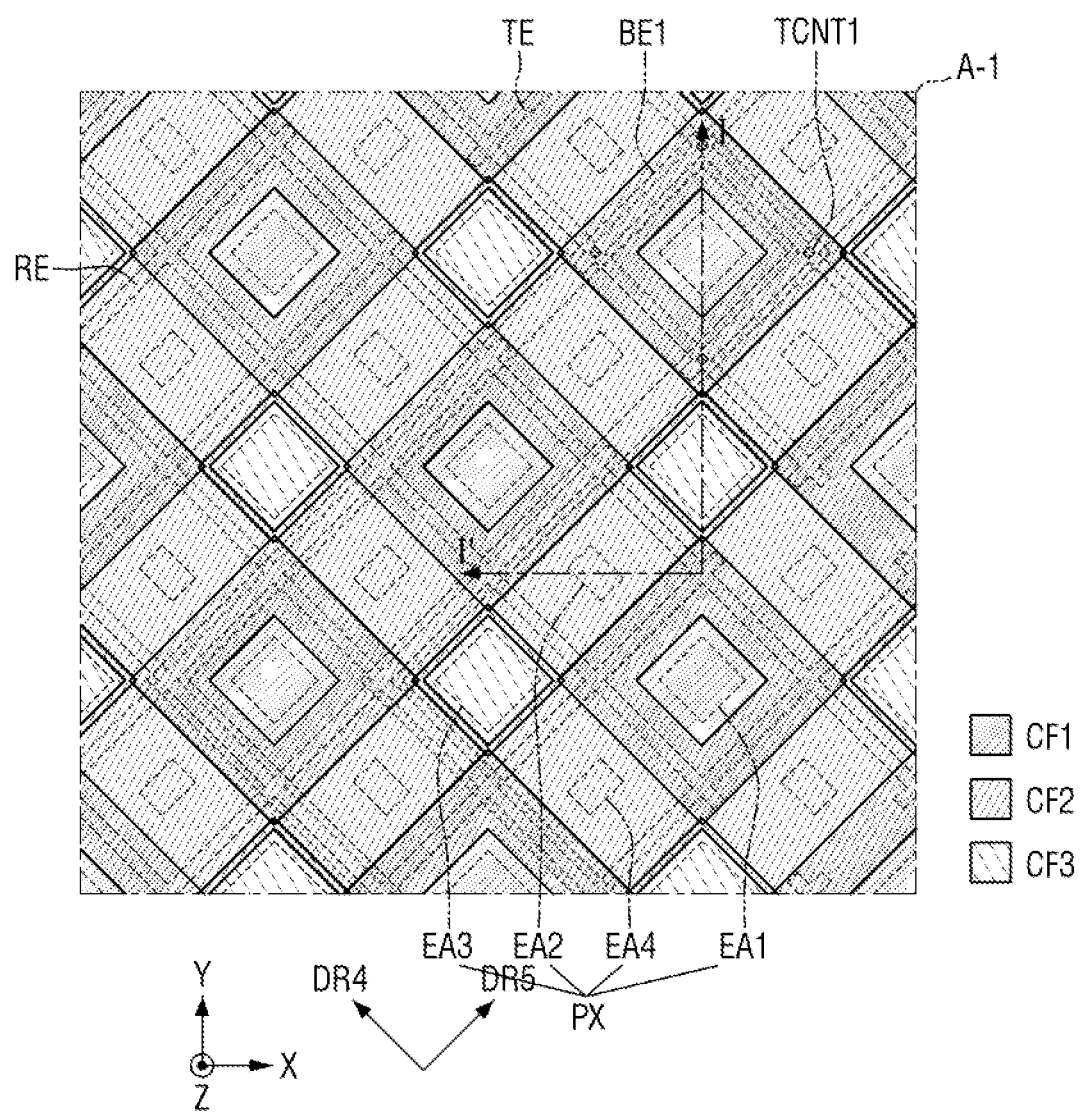
FIG. 16 is an enlarged plan view specifically illustrating another example of the area A-1 of FIG. 5 according to the present invention.

FIG. 16 is an enlarged plan view specifically illustrating another example of the area A-1 of FIG. 5.

In FIG. 16, for convenience of description, the driving electrode TE, the sensing electrode RE, the connection electrode BEL the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

The embodiment of FIG. 16 is different from the embodiment of FIG. 6 in that in addition to the first color filter CF1, the second color filter CF2 overlaps the driving electrode TE, the sensing electrode RE, and the connection electrode BE1 in the third direction (Z-axis direction). In FIG. 16, differences from the embodiment of FIG. 6 will be mainly described.

Referring to FIG. 16, each of the first color filter CF1 and the second color filter CF2 may overlap the driving electrode TE, the sensing electrode RE, and the connection electrode BE1 in the third direction (Z-axis direction). The first color filter CF1 may overlap the driving electrode TE, the sensing electrode RE, and the connection electrode BE1, which are respectively disposed between the first light emitting unit EA1 and the second light emitting unit EA2 and between the first light emitting unit EA1 and the fourth light emitting unit EA4, in the third direction (Z-axis direction). The second color filter CF2 may be commonly disposed on the second light emitting units EA2 and the fourth light emitting units EA4. The first color filter CF1 may have an island shape from a plan view. For example, the first color filters CF1 disposed on the first light emitting units EA1 adjacent to each other in the fourth direction DR4 and the fifth direction DR5 may be disposed apart from each other.

The second color filter CF2 may overlap the driving electrode TE, the sensing electrode RE, and the connection electrode BE1, which are disposed between the first light emitting unit EA1 and the second light emitting unit EA2, between the second light emitting unit EA2 and the third light emitting unit EA3, between the third light emitting unit EA3 and the fourth light emitting unit EA4, and between the first light emitting unit EA1 and the fourth light emitting unit EA4, in the third direction (Z-axis direction). The second color filter CF2 may be commonly disposed on the second light emitting units EA2 and the fourth light emitting units EA4.

The third color filter CF3 does not overlap the driving electrode TE, the sensing electrode RE, and the connection electrode BE1 in the third direction (Z-axis direction). The third color filter CF3 may have an island shape from a plan view. The third color filters CF3 disposed on the third light emitting units EA3 adjacent to each other in the fourth direction DR4 and the fifth direction DR5 may be disposed apart from each other.

The area of the first color filter CF1 may be larger than the area of the third color filter CF3. Each of the first color filter CF1 and the second color filter CF2 may overlap the crossing portion CP of the driving electrode TE and the crossing portion CP of the sensing electrode RE in the third direction (Z-axis direction). The third color filter CF3 may not overlap the crossing portion CP of the driving electrode TE and the crossing portion CP of the sensing electrode RE in the third direction (Z-axis direction). FIG. 5 shows where the crossing portions CP of the driving electrode TE and the crossing portions CP of the sensing electrode RE are located.

The overlapping region of the first color filter CF1 and the second color filter CF2 in the third direction (Z-axis direction) may be disposed to surround the first light emitting unit EA1. The overlapping region of the first color filter CF1 and the second color filter CF2 in the third direction (Z-axis direction) may overlap the driving electrode TE or the sensing electrode RE in the third direction (Z-axis direction).

The overlapping region of the second color filter CF2 and the third color filter CF3 in the third direction (Z-axis direction) may be disposed to surround the third light emitting unit EA3. The overlapping region of the first color filter CF1 and the third color filter CF3 in the third direction (Z-axis direction) may be surrounded by the driving electrode TE or the sensing electrode RE. The overlapping region of the second color filter CF2 and the third color filter CF3 in the third direction (Z-axis direction) may not overlap the driving electrode TE, the sensing electrode RE, and the connection electrode BE1 in the third direction (Z-axis direction).

Figure 17:
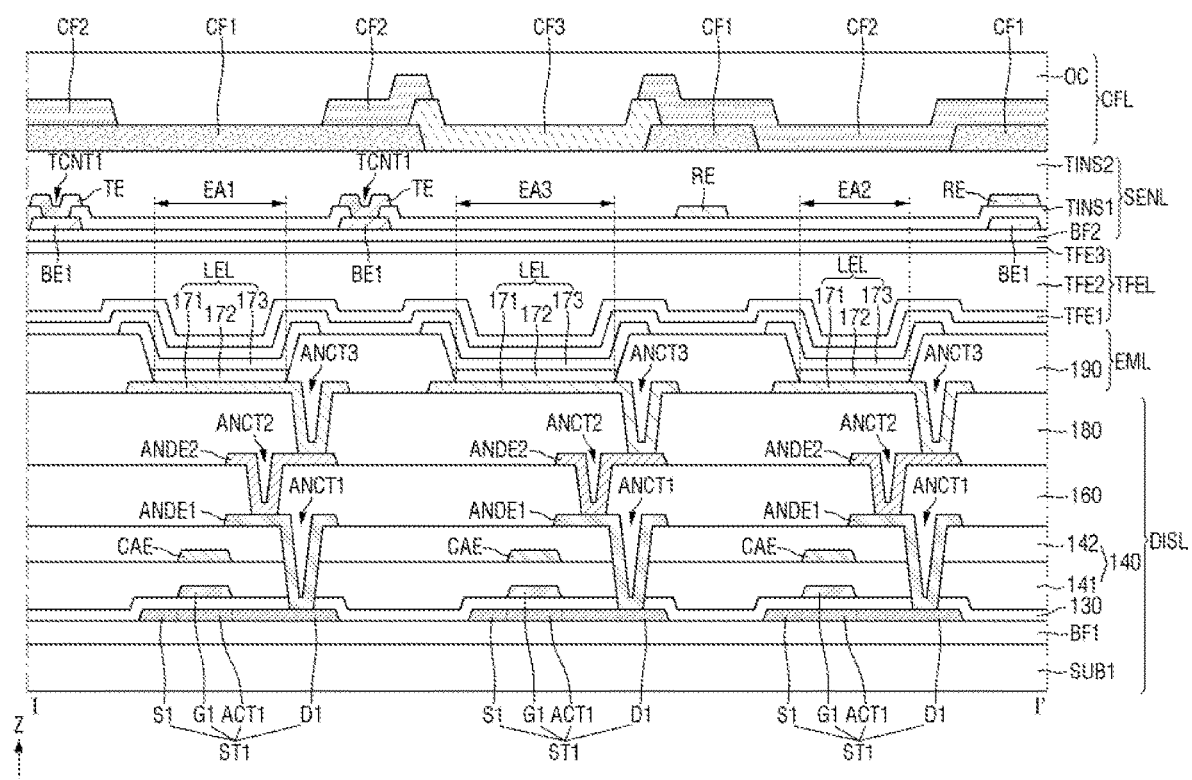
FIG. 17 is a cross-sectional view illustrating another example of a display panel taken along the line I-I' of FIG. 16 according to the present invention.

FIG. 17 is a cross-sectional view illustrating another example of a display panel taken along the line I-I' of FIG. 16.

The embodiment of FIG. 17 is different from the embodiment of FIG. 7 in that, in addition to the first color CF1, the second color filter CF2 overlaps the driving electrode TE, the sensing electrode RE, and the connection electrode BE1 in the third direction (Z-axis direction). In FIG. 17, differences from the embodiment of FIG. 7 will be mainly described.

The first color filter CF1 overlaps the driving electrode TE and the sensing electrode RE in the third direction (Z-axis direction). The first color filter CF1 may overlap the connection electrode BE1 in the third direction (Z-axis direction). The first color filter CF1 may overlap the touch contact hole TCNT1 in the third direction (Z-axis direction).

The second color filter CF2 may overlap the driving electrode TE and the sensing electrode RE in the third direction (Z-axis direction). The second color filter CF2 may overlap the connection electrode BE1 in the third direction (Z-axis direction). The second color filter CF2 may overlap the touch contact hole TCNT1 in the third direction (Z-axis direction).

The third color filter CF3 may not overlap the driving electrode TE and the sensing electrode RE in the third direction (Z-axis direction). The third color filter CF3 may not overlap the connection electrode BE1 in the third direction (Z-axis direction). The third color filter CF3 may not overlap the touch contact hole TCNT1 in the third direction (Z-axis direction).

The overlapping region of the first color filter CF1 and the second color filter CF2 in the third direction (Z-axis direction) may overlap the driving electrode TE, the sensing electrode RE, and the connection electrode BE1 in the third direction (Z-axis direction). The overlapping region of the second color filter CF2 and the third color filter CF3 in the third direction (Z-axis direction) may not overlap the driving electrode TE, the sensing electrode RE, and the connection electrode BE1 in the third direction (Z-axis direction). The overlapping region of the first color filter CF1 and the third color filter CF3 in the third direction (Z-axis direction) may not overlap the driving electrode TE, the sensing electrode RE, and the connection electrode BE1 in the third direction (Z-axis direction).

Since a portion of the third color filter CF3 is disposed on the first color filter CF1 and a portion of the second color filter CF3 is disposed on the portion of the third color filter CF3 as shown in FIG. 17, after the first color filter CF3 is formed on the touch sensing layer SENL, the third color filter CF3 may be formed, and then second color filter CF2 may be formed. However, embodiments of the present specification are not limited thereto.

For example, the second color filter CF2 may be disposed on the first color filter CF1, and the third color filter CF3 may be disposed on the second color filter CF2. In this case, after the first color filter CF1 is formed on the touch sensing layer SENL, the second color filter CF2 may be formed, and then the third color filter CF3 may be formed.

Alternatively, any one of the first color filter CF1 and the second color filter CF2 may be disposed on the third color filter CF3, and the other one of the first color filter CF1 and the second color filter CF2 may be disposed on any one of the first color filter CF1 and the second color filter CF2. In this case, after the third color filter CF3 is formed on the touch sensing layer SENL, any one of the first color filter CF1 and the second color filter CF2 may be formed, and then the other one of the first color filter CF1 and the second color filter CF2 may be formed.

Alternatively, any one of the first color filter CF1 and the third color filter CF3 may be disposed on the third color filter CF3, and the other one of the first color filter CF1 and the third color filter CF3 may be disposed on any one of the first color filter CF1 and the third color filter CF3. In this case, after the second color filter CF2 is formed on the touch sensing layer SENL, any one of the first color filter CF1 and the third color filter CF3 may be formed, and then the other one of the first color filter CF1 and the third color filter CF3 may be formed.

As shown in FIGS. 16 and 17, the color filter layer CFL may be formed of without including a black matrix, and the driving electrode TE and the sensing electrode RE include a second conductive layer serving as a low-reflective layer CL2 as shown in FIG. 8. Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

As shown in FIGS. 16 and 17, the second color filter CF2 overlaps the driving electrode TE and the sensing electrode RE in the third direction (Z-axis direction). Accordingly, the second color filter CF2 may block light in the blue wavelength range reflected from the second conductive layer CL2. Therefore, it is possible to prevent or reduce the light reflected from the second conductive layer CL2 of the driving electrode TE and the sensing electrode RE from being output to the outside and thus being visually recognized by the user.

Figure 18:
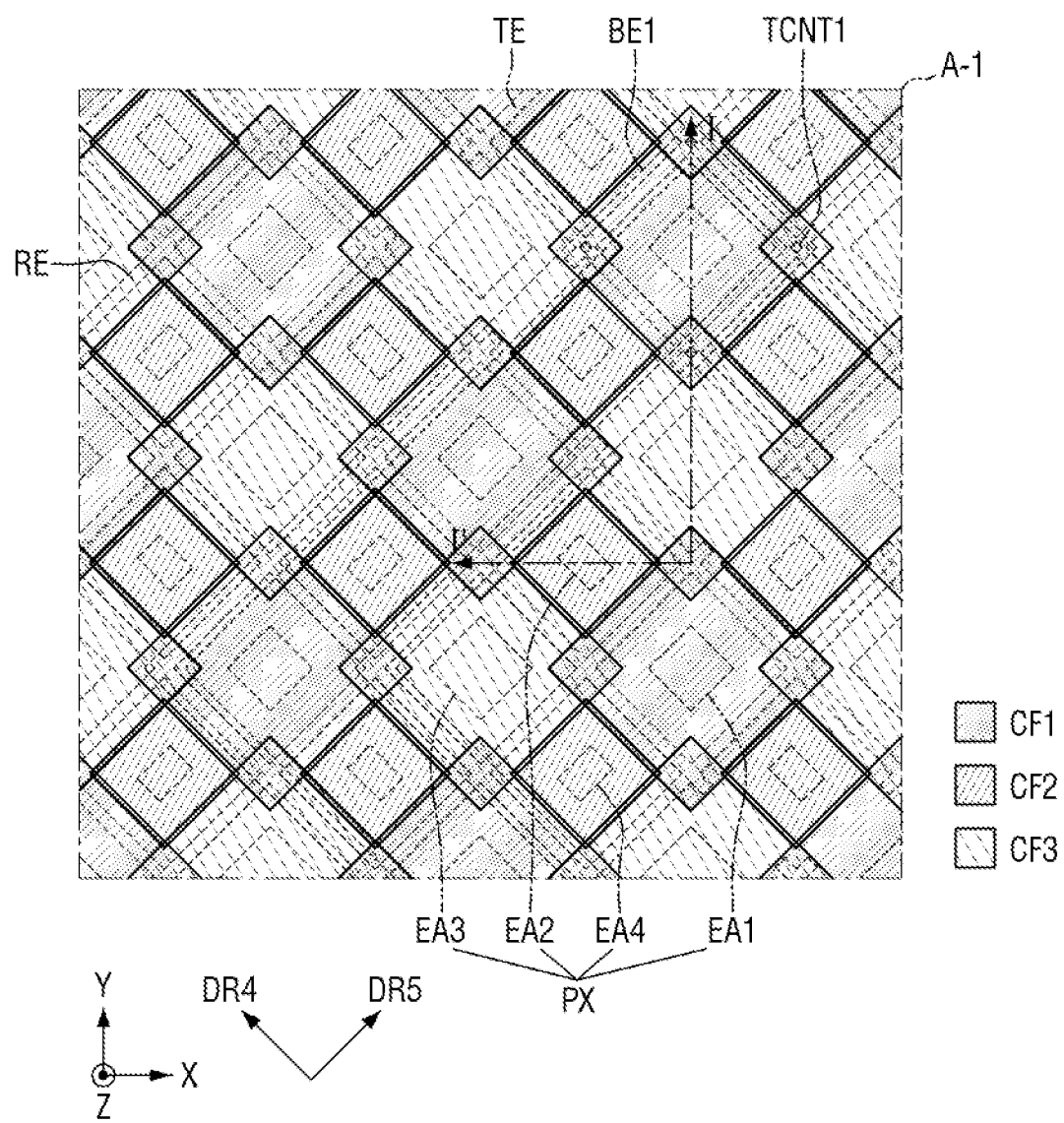
FIG. 18 is an enlarged plan view specifically illustrating another example of the area A-1 of FIG. 5 according to the present invention.

FIG. 18 is an enlarged plan view specifically illustrating another example of the area A-1 of FIG. 5.

In FIG. 18, for convenience of description, the driving electrode TE, the sensing electrode RE, the connection electrode BEL the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

The embodiment of FIG. 18 is different from the embodiment of FIG. 6 in that in addition to the first color filter CF1, the third color filter CF3 overlaps the driving electrode TE, the sensing electrode RE, and the connection electrode BE1 in the third direction (Z-axis direction). In FIG. 18, differences from the embodiment of FIG. 6 will be mainly described.

Referring to FIG. 18, each of the first color filter CF1 and the third color filter CF3 may overlap the driving electrode TE, the sensing electrode RE, and the connection electrode BE1 in the third direction (Z-axis direction).

The first color filter CF1 may overlap the driving electrode TE, the sensing electrode RE, and the connection electrode BE1, which are respectively disposed between the first light emitting unit EA1 and the second light emitting unit EA2 and between the first light emitting unit EA1 and the fourth light emitting unit EA4, in the third direction (Z-axis direction). The first color filter CF1 may have an island shape from a plan view. For example, the first color filters CF1 disposed on the first light emitting units EA1 adjacent to each other in the fourth direction DR4 and the fifth direction DR5 may be disposed apart from each other.

The third color filter CF3 may overlap the driving electrode TE, the sensing electrode RE, and the connection electrode BE1, which are disposed between the second light emitting unit EA2 and the third light emitting unit EA3 and between the third light emitting unit EA3 and the fourth light emitting unit EA4, in the third direction (Z-axis direction). The third color filter CF3 may have an island shape from a plan view. For example, the third color filters CF3 disposed on the third light emitting units EA3 adjacent to each other in the fourth direction DR4 and the fifth direction DR5 may be disposed apart from each other.

The second color filter CF2 does not overlap the driving electrode TE, the sensing electrode RE, and the connection electrode BE1 in the third direction (Z-axis direction). The second color filter CF3 may have an island shape from a plan view. The second color filters CF2 disposed on the second light emitting units EA2 adjacent to each other in the fourth direction DR4 and the fifth direction DR5 may be disposed apart from each other.

The area of the first color filter CF1 may be substantially the same as the area of the third color filter CF3. The area of the first color filter CF1 may be larger than the area of the second color filter CF2. The area of the third color filter CF3 may be larger than the area of the second color filter CF2.

The first color filter CF1 and the third color filter CF3 may overlap the crossing portion CP of the driving electrode TE and the crossing portion CP of the sensing electrode RE in the third direction (Z-axis direction). The second color filter CF2 may not overlap the crossing portion CP of the driving electrode TE and the crossing portion CP of the sensing electrode RE in the third direction (Z-axis direction). FIG. 5 shows where the crossing portions CP of the driving electrode TE and the crossing portions CP of the sensing electrode RE are located.

The overlapping region of the first color filter CF1 and the second color filter CF2 in the third direction (Z-axis direction) may not overlap the driving electrode TE or the sensing electrode RE in the third direction (Z-axis direction). The overlapping region of the second color filter CF2 and the third color filter CF3 in the third direction (Z-axis direction) may not overlap the driving electrode TE or the sensing electrode RE in the third direction (Z-axis direction).

Figure 19:
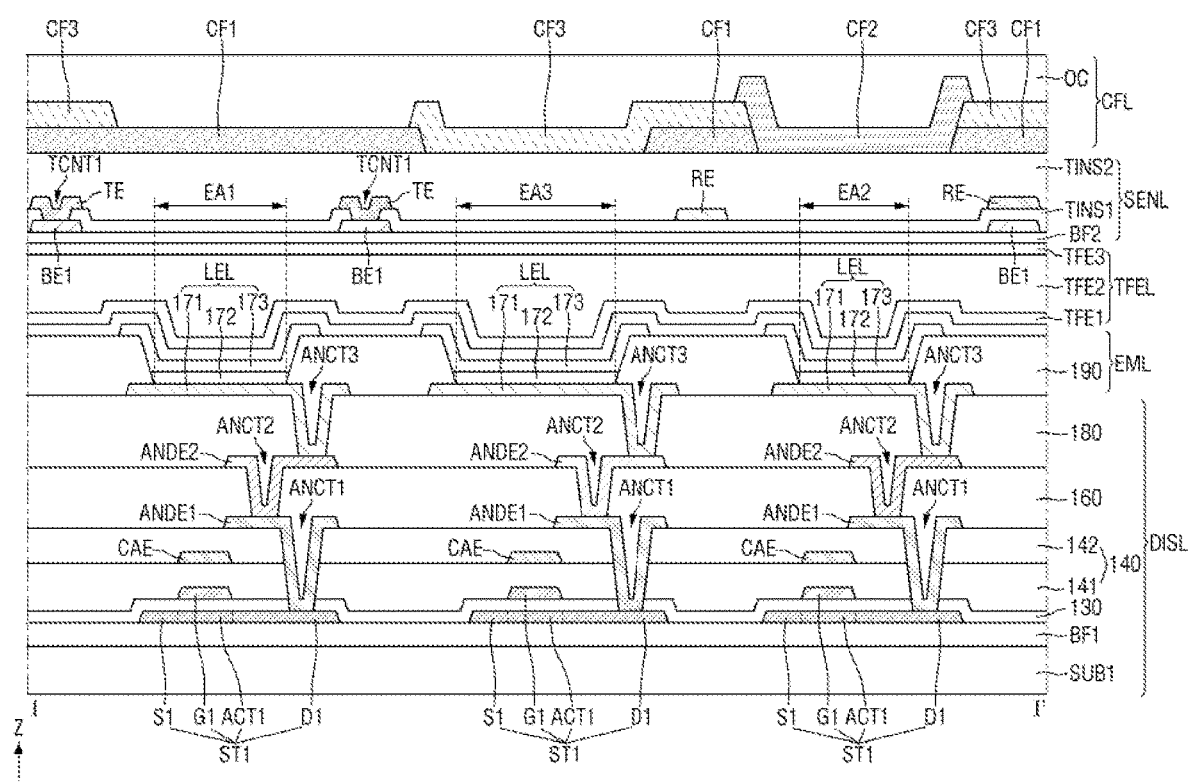
FIG. 19 is a cross-sectional view illustrating another example of a display panel taken along the line I-I' of FIG. 18 according to the present invention.

FIG. 19 is a cross-sectional view illustrating another example of a display panel taken along the line I-I' of FIG. 18.

The embodiment of FIG. 19 is different from the embodiment of FIG. 7 in that, in addition to the first color CF1, the third color filter CF3 overlaps the driving electrode TE, the sensing electrode RE, and the connection electrode BE1 in the third direction (Z-axis direction). In FIG. 19, differences from the embodiment of FIG. 7 will be mainly described.

The first color filter CF1 may overlap the driving electrode TE and the sensing electrode RE in the third direction (Z-axis direction). The first color filter CF1 may overlap the connection electrode BE1 in the third direction (Z-axis direction). The first color filter CF1 may overlap the touch contact hole TCNT1 in the third direction (Z-axis direction).

The second color filter CF2 may not overlap the driving electrode TE and the sensing electrode RE in the third direction (Z-axis direction). The second color filter CF2 may not overlap the connection electrode BE1 in the third direction (Z-axis direction). The second color filter CF2 may not overlap the touch contact hole TCNT1 in the third direction (Z-axis direction).

The third color filter CF3 may overlap the driving electrode TE and the sensing electrode RE in the third direction (Z-axis direction). The third color filter CF3 may overlap the connection electrode BE1 in the third direction (Z-axis direction). The third color filter CF3 may overlap the touch contact hole TCNT1 in the third direction (Z-axis direction).

The overlapping region of the first color filter CF1 and the second color filter CF2 in the third direction (Z-axis direction) may not overlap the driving electrode TE, the sensing electrode RE, and the connection electrode BE1 in the third direction (Z-axis direction). The overlapping region of the second color filter CF2 and the third color filter CF3 in the third direction (Z-axis direction) may not overlap the driving electrode TE, the sensing electrode RE, and the connection electrode BE1 in the third direction (Z-axis direction). The overlapping region of the first color filter CF1 and the third color filter CF3 in the third direction (Z-axis direction) may overlap the driving electrode TE, the sensing electrode RE, and the connection electrode BE1 in the third direction (Z-axis direction).

Since the third color filter CF3 is disposed on the first color filter CF1 and the second color filter CF3 is disposed on the third color filter CF3 as shown in FIG. 19, after the first color filter CF3 is formed on the touch sensing layer SENL, the third color filter CF3 may be formed, and then second color filter CF2 may be formed. However, embodiments of the present specification are not limited thereto.

For example, the second color filter CF2 may be disposed on the first color filter CF1, and the third color filter CF3 may be disposed on the second color filter CF2. In this case, after the first color filter CF1 is formed on the touch sensing layer SENL, the second color filter CF2 may be formed, and then the third color filter CF3 may be formed.

Alternatively, any one of the first color filter CF1 and the second color filter CF2 may be disposed on the third color filter CF3, and the other one of the first color filter CF1 and the second color filter CF2 may be disposed on any one of the first color filter CF1 and the second color filter CF2. In this case, after the third color filter CF3 is formed on the touch sensing layer SENL, any one of the first color filter CF1 and the second color filter CF2 may be formed, and then the other one of the first color filter CF1 and the second color filter CF2 may be formed.

Alternatively, any one of the first color filter CF1 and the third color filter CF3 may be disposed on the second color filter CF2, and the other one of the first color filter CF1 and the third color filter CF3 may be disposed on any one of the first color filter CF1 and the third color filter CF3. In this case, after the second color filter CF2 is formed on the touch sensing layer SENL, any one of the first color filter CF1 and the third color filter CF3 may be formed, and then the other one of the first color filter CF1 and the third color filter CF3 may be formed.

As shown in FIGS. 18 and 19, the color filter layer CFL may be formed without including a black matrix, and the driving electrode TE and the sensing electrode RE include a second conductive layer serving as a low-reflective layer CL2 as shown in FIG. 8. Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

As shown in FIGS. 18 and 19, the second color filter CF2 overlaps the driving electrode TE and the sensing electrode RE in the third direction (Z-axis direction). Accordingly, the second color filter CF2 may block light in the blue wavelength range reflected from the second conductive layer CL2. Therefore, it is possible to prevent or reduce the light reflected from the second conductive layer CL2 of the driving electrode TE and the sensing electrode RE from being output to the outside and thus being visually recognized by the user.

Figure 20:
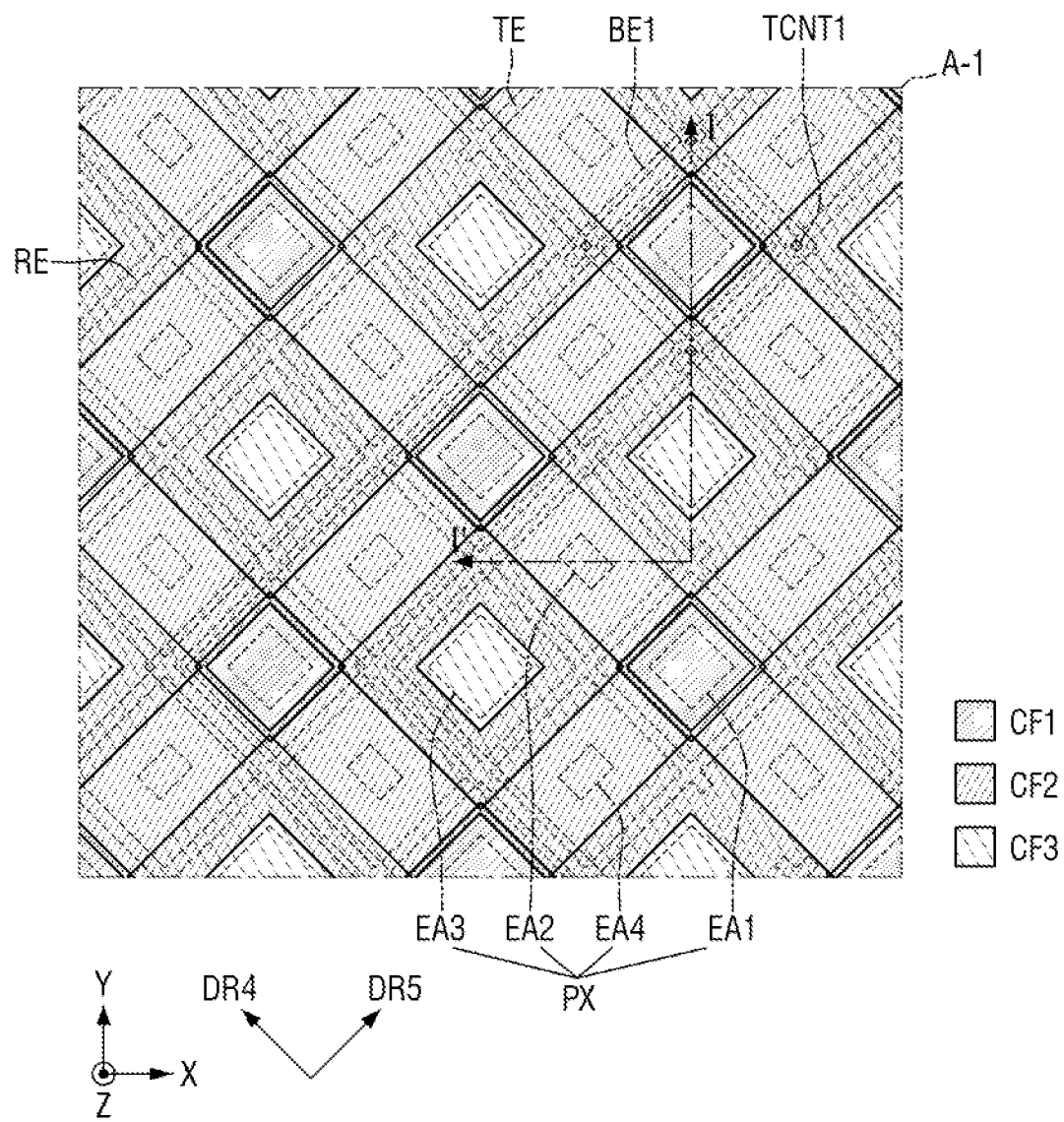
FIG. 20 is an enlarged plan view specifically illustrating another example of the area A-1 of FIG. 5 according to the present invention.

FIG. 20 is an enlarged plan view specifically illustrating another example of the area A-1 of FIG. 5.

In FIG. 20, for convenience of description, the driving electrode TE, the sensing electrode RE, the connection electrode BEL the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

The embodiment of FIG. 20 is different from the embodiment of FIG. 6 in that the second color filter CF2 and the third color filter CF3, not the first color filter CF1, overlap the driving electrode TE, the sensing electrode RE, and the connection electrode BE1 in the third direction (Z-axis direction). In FIG. 20, differences from the embodiment of FIG. 6 will be mainly described.

Referring to FIG. 20, each of the second color filter CF2 and the third color filter CF3 may overlap the driving electrode TE, the sensing electrode RE, and the connection electrode BE1 in the third direction (Z-axis direction).

The second color filter CF2 may overlap the driving electrode TE, the sensing electrode RE, and the connection electrode BE1, which are respectively disposed between the first light emitting unit EA1 and the second light emitting unit EA2, between the second light emitting unit EA2 and the third light emitting unit EA3, between the third light emitting unit EA3 and the fourth light emitting unit EA4, and between the first light emitting unit EA1 and the fourth light emitting unit EA4, in the third direction (Z-axis direction). The second color filter CF2 may be commonly disposed on the second light emitting units EA2 and the fourth light emitting units EA4.

The third color filter CF3 may overlap the driving electrode TE, the sensing electrode RE, and the connection electrode BE1, which are disposed between the second light emitting unit EA2 and the third light emitting unit EA3 and between the third light emitting unit EA3 and the fourth light emitting unit EA4, in the third direction (Z-axis direction). The third color filter CF3 may have an island shape from a plan view. For example, the third color filters CF3 disposed on the third light emitting units EA3 adjacent to each other in the fourth direction DR4 and the fifth direction DR5 may be disposed apart from each other.

The first color filter CF1 does not overlap the driving electrode TE, the sensing electrode RE, and the connection electrode BE1 in the third direction (Z-axis direction). The first color filter CF1 may have an island shape from a plan view. The first color filters CF1 disposed on the first light emitting units EA1 adjacent to each other in the fourth direction DR4 and the fifth direction DR5 may be disposed apart from each other.

The area of the third color filter CF3 may be larger than the area of the first color filter CF1. The second color filter CF2 and the third color filter CF3 may overlap the crossing portion CP of the driving electrode TE and the crossing portion CP of the sensing electrode RE in the third direction (Z-axis direction). The first color filter CF1 may not overlap the crossing portion CP of the driving electrode TE and the crossing portion CP of the sensing electrode RE in the third direction (Z-axis direction). FIG. 5 shows where the crossing portions CP of the driving electrode TE and the crossing portions CP of the sensing electrode RE are located.

The overlapping area of the second color filter CF2 and the third color filter CF3 in the third direction (Z-axis direction) may be disposed to surround the third light emitting unit EA3. The overlapping region of the second color filter CF2 and the third color filter CF3 in the third direction (Z-axis direction) may overlap the driving electrode TE or the sensing electrode RE in the third direction (Z-axis direction).

The overlapping region of the first color filter CF1 and the second color filter CF2 in the third direction (Z-axis direction) may be disposed to surround the first light emitting unit EA1. The overlapping region of the first color filter CF1 and the second color filter CF2 in the third direction (Z-axis direction) may be surrounded by the driving electrode TE or the sensing electrode RE. The overlapping region of the first color filter CF1 and the second color filter CF2 in the third direction (Z-axis direction) may not overlap the driving electrode TE or the sensing electrode RE in the third direction (Z-axis direction).

Figure 21:
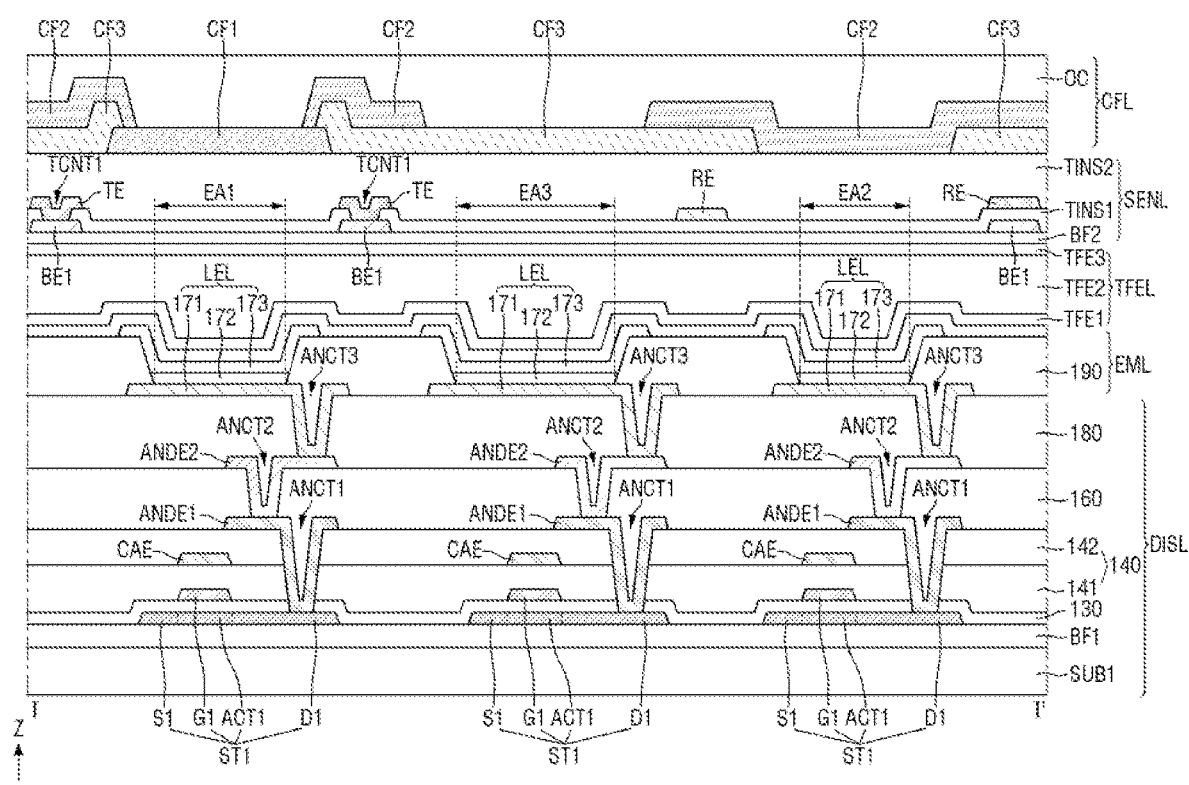
FIG. 21 is a cross-sectional view illustrating another example of a display panel taken along the line I-I' of FIG. 20 according to the present invention.

FIG. 21 is a cross-sectional view illustrating another example of a display panel taken along the line I-I' of FIG. 20.

The embodiment of FIG. 21 is different from the embodiment of FIG. 7 in that, in addition to the first color CF1, the second color filter CF2 and the third color filter CF3 overlaps the driving electrode TE, the sensing electrode RE, and the connection electrode BE1 in the third direction (Z-axis direction). In FIG. 21, differences from the embodiment of FIG. 7 will be mainly described.

The first color filter CF1 may not overlap the driving electrode TE and the sensing electrode RE in the third direction (Z-axis direction). The first color filter CF1 may not overlap the connection electrode BE1 in the third direction (Z-axis direction). The first color filter CF1 may not overlap the touch contact hole TCNT1 in the third direction (Z-axis direction).

The second color filter CF2 may overlap the driving electrode TE and the sensing electrode RE in the third direction (Z-axis direction). The second color filter CF2 may overlap the connection electrode BE1 in the third direction (Z-axis direction). The second color filter CF2 may overlap the touch contact hole TCNT1 in the third direction (Z-axis direction).

The third color filter CF3 may overlap the driving electrode TE and the sensing electrode RE in the third direction (Z-axis direction). The third color filter CF3 may overlap the connection electrode BE1 in the third direction (Z-axis direction). The third color filter CF3 may overlap the touch contact hole TCNT1 in the third direction (Z-axis direction).

The overlapping region of the first color filter CF1 and the second color filter CF2 in the third direction (Z-axis direction) may not overlap the driving electrode TE, the sensing electrode RE, and the connection electrode BE1 in the third direction (Z-axis direction). The overlapping region of the second color filter CF2 and the third color filter CF3 in the third direction (Z-axis direction) may overlap the driving electrode TE, the sensing electrode RE, and the connection electrode BE1 in the third direction (Z-axis direction). The overlapping region of the first color filter CF1 and the third color filter CF3 in the third direction (Z-axis direction) may not overlap the driving electrode TE, the sensing electrode RE, and the connection electrode BE1 in the third direction (Z-axis direction).

Since the third color filter CF3 is disposed on the first color filter CF1 and the second color filter CF3 is disposed on the third color filter CF3 as shown in FIG. 21, after the first color filter CF3 is formed on the touch sensing layer SENL, the third color filter CF3 may be formed, and then second color filter CF2 may be formed. However, embodiments of the present specification are not limited thereto.

For example, the second color filter CF2 may be disposed on the first color filter CF1, and the third color filter CF3 may be disposed on the second color filter CF2. In this case, after the first color filter CF1 is formed on the touch sensing layer SENL, the second color filter CF2 may be formed, and then the third color filter CF3 may be formed.

Alternatively, any one of the first color filter CF1 and the second color filter CF2 may be disposed on the third color filter CF3, and the other one of the first color filter CF1 and the second color filter CF2 may be disposed on any one of the first color filter CF1 and the second color filter CF2. In this case, after the third color filter CF3 is formed on the touch sensing layer SENL, any one of the first color filter CF1 and the second color filter CF2 may be formed, and then the other one of the first color filter CF1 and the second color filter CF2 may be formed.

Alternatively, any one of the first color filter CF1 and the third color filter CF3 may be disposed on the second color filter CF2, and the other one of the first color filter CF1 and the third color filter CF3 may be disposed on any one of the first color filter CF1 and the third color filter CF3. In this case, after the second color filter CF2 is formed on the touch sensing layer SENL, any one of the first color filter CF1 and the third color filter CF3 may be formed, and then the other one of the first color filter CF1 and the third color filter CF3 may be formed.

As shown in FIGS. 20 and 21, the color filter layer CFL may be formed without including a black matrix, and the driving electrode TE and the sensing electrode RE include a second conductive layer serving as a low-reflective layer CL2 as shown in FIG. 8. Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

As shown in FIGS. 20 and 21, the second color filter CF2 overlaps the driving electrode TE and the sensing electrode RE in the third direction (Z-axis direction). Accordingly, the second color filter CF2 may block light in the blue wavelength range reflected from the second conductive layer CL2. Therefore, it is possible to prevent or reduce the light reflected from the second conductive layer CL2 of the driving electrode TE and the sensing electrode RE from being output to the outside and thus being visually recognized by the user.

Figure 22:
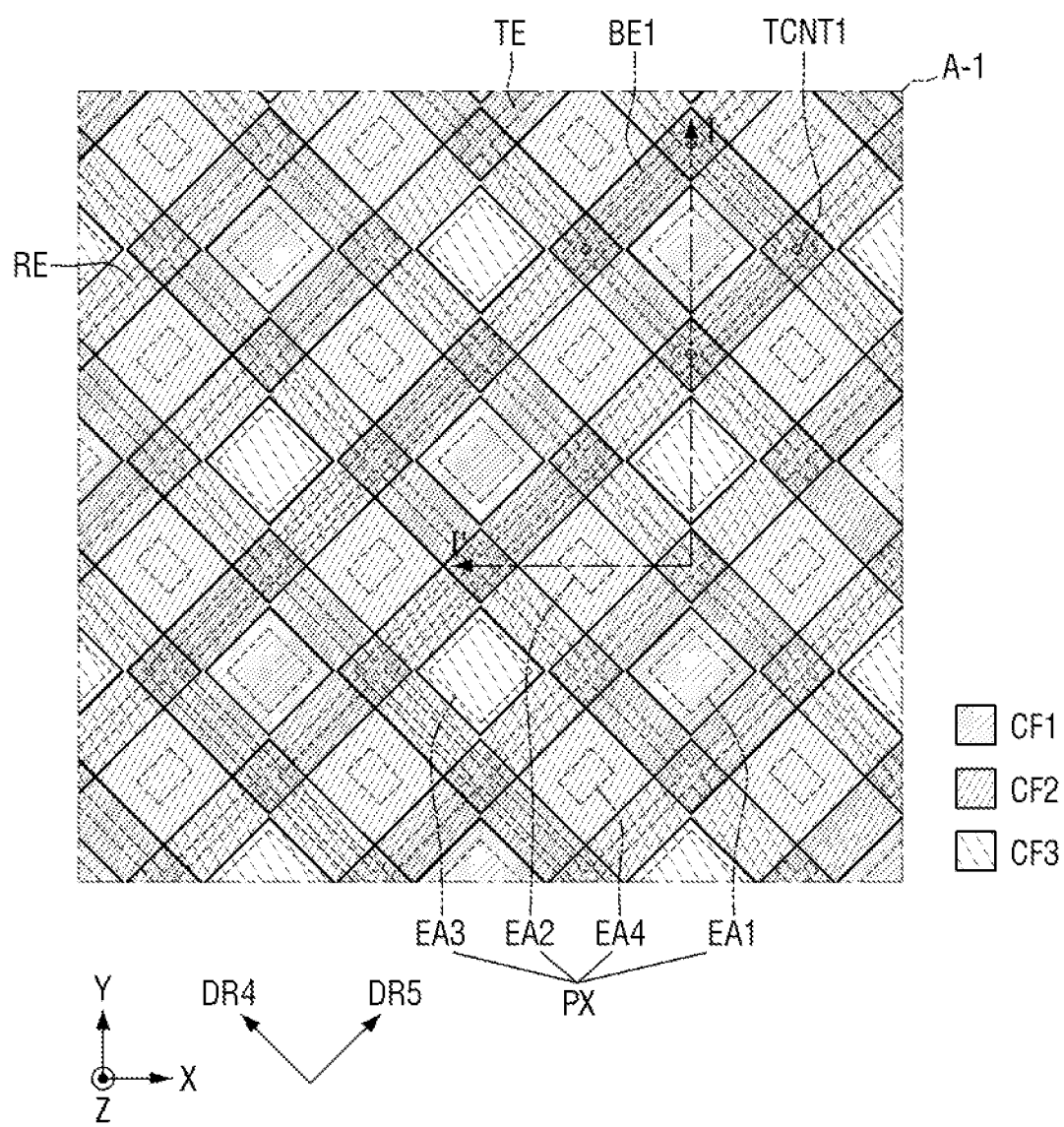
FIG. 22 is an enlarged plan view specifically illustrating another example of the area A-1 of FIG. 5 according to the present invention.

FIG. 22 is an enlarged plan view specifically illustrating another example of the area A-1 of FIG. 5.

In FIG. 22, for convenience of description, the driving electrode TE, the sensing electrode RE, the connection electrode BE1, the first light emitting unit EA1, the second light emitting unit EA2, the third light emitting unit EA3, and the fourth light emitting unit EA4 are expressed by dotted lines, and the first color filter CF1, second color filter CF2, and third color filter CF3 of the color filter layer CFL are expressed by solid lines.

The embodiment of FIG. 22 is different from the embodiment of FIG. 6 in that in addition of the first color filter CF1, each of the second color filter CF2 and the third color filter CF3 overlaps the driving electrode TE, the sensing electrode RE, and the connection electrode BE1 in the third direction (Z-axis direction). In FIG. 22, differences from the embodiment of FIG. 6 will be mainly described.

Referring to FIG. 22, each of the first color filter CF1, the second color filter CF2, and the third color filter CF3 may overlap the driving electrode TE, the sensing electrode RE, and the connection electrode BE1 in the third direction (Z-axis direction).

The first color filter CF1 may overlap the driving electrode TE, the sensing electrode RE, and the connection electrode BE1, which are respectively disposed between the first light emitting unit EA1 and the second light emitting unit EA2 and between the first light emitting unit EA1 and the fourth light emitting unit EA4, in the third direction (Z-axis direction). The first color filter CF1 may have an island shape from a plan view. For example, the first color filters CF3 disposed on the first light emitting units EA1 adjacent to each other in the fourth direction DR4 and the fifth direction DR5 may be disposed apart from each other.

The second color filter CF2 may overlap the driving electrode TE, the sensing electrode RE, and the connection electrode BE1, which are disposed between the first light emitting unit EA1 and the second light emitting unit EA2, between the second light emitting unit EA2 and the third light emitting unit EA3, between the third light emitting unit EA3 and the fourth light emitting unit EA4, and between the first light emitting unit EA1 and the fourth light emitting unit EA4, in the third direction (Z-axis direction). The second color filter CF2 may be commonly disposed on the second light emitting units EA2 and the fourth light emitting units EA4.

The third color filter CF3 overlaps the driving electrode TE, the sensing electrode RE, and the connection electrode BE1, which are disposed between the second light emitting unit EA2 and the third light emitting unit EA3 and between the third light emitting unit EA3 and the fourth light emitting unit EA4, in the third direction (Z-axis direction). The third color filter CF3 may have an island shape from a plan view. For example, the third color filters CF3 disposed on the third light emitting units EA3 adjacent to each other in the fourth direction DR4 and the fifth direction DR5 may be disposed apart from each other.

The area of the first color filter CF1 may be substantially the same as the area of the third color filter CF3. The first color filter CF1, the second color filter CF2, and the third color filter CF3 may overlap the crossing portion CP of the driving electrode TE and the crossing portion CP of the sensing electrode RE in the third direction (Z-axis direction). FIG. 5 shows where the crossing portions CP of the driving electrode TE and the crossing portions CP of the sensing electrode RE are located.

The overlapping area of the first color filter CF1 and the second color filter CF2 in the third direction (Z-axis direction) may be disposed to surround the first light emitting unit EA1. The overlapping region of the first color filter CF1 and the second color filter CF2 in the third direction (Z-axis direction) may overlap the driving electrode TE or the sensing electrode RE in the third direction (Z-axis direction).

The overlapping region of the second color filter CF2 and the third color filter CF3 in the third direction (Z-axis direction) may be disposed to surround the third light emitting unit EA3. The overlapping region of the second color filter CF2 and the third color filter CF3 in the third direction (Z-axis direction) may overlap the driving electrode TE or the sensing electrode RE in the third direction (Z-axis direction).

Figure 23:
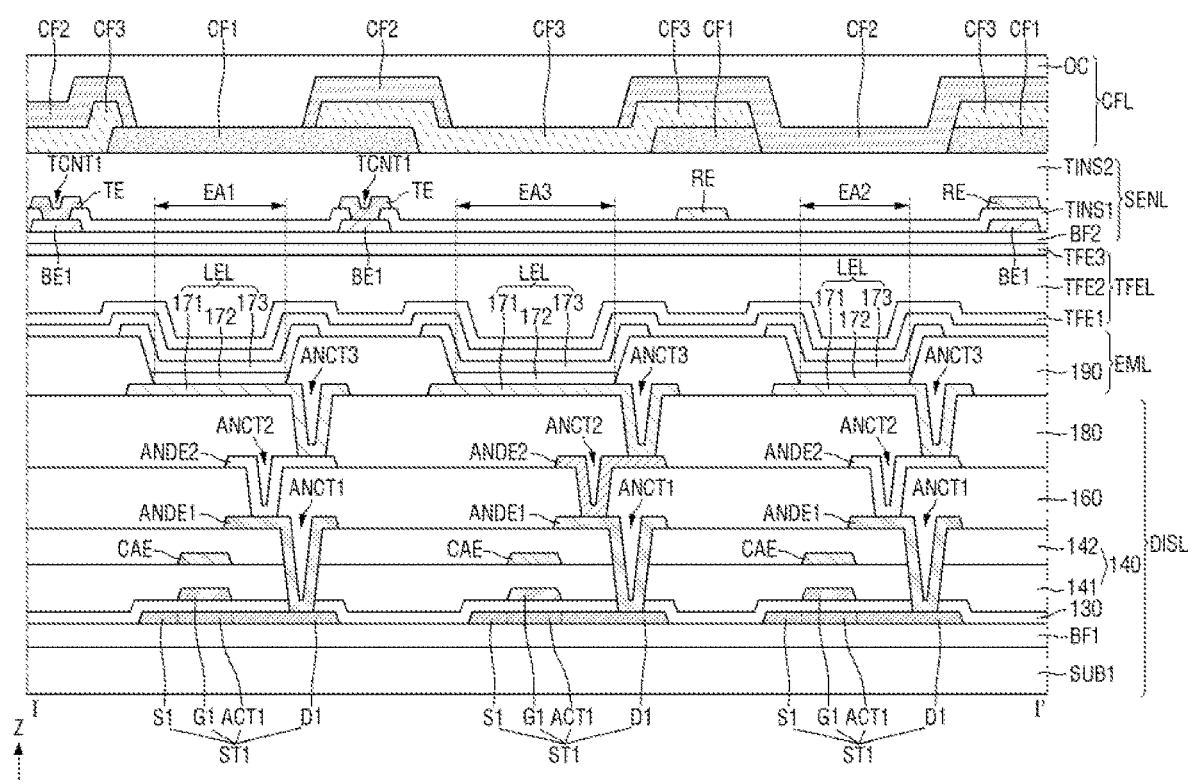
FIG. 23 is a cross-sectional view illustrating another example of a display panel taken along the line I-I' of FIG. 22 according to the present invention.

FIG. 23 is a cross-sectional view illustrating another example of a display panel taken along the line I-I' of FIG. 22.

The embodiment of FIG. 23 is different from the embodiment of FIG. 7 in that, in addition to the first color CF1, the second color filter CF2 and the third color filter CF3 overlaps the driving electrode TE, the sensing electrode RE, and the connection electrode BE1 in the third direction (Z-axis direction). In FIG. 23, differences from the embodiment of FIG. 7 will be mainly described.

The first color filter CF1 may overlap the driving electrode TE and the sensing electrode RE in the third direction (Z-axis direction). The first color filter CF1 may overlap the connection electrode BE1 in the third direction (Z-axis direction). The first color filter CF1 may overlap the touch contact hole TCNT1 in the third direction (Z-axis direction).

The second color filter CF2 may overlap the driving electrode TE and the sensing electrode RE in the third direction (Z-axis direction). The second color filter CF2 may overlap the connection electrode BE1 in the third direction (Z-axis direction). The second color filter CF2 may overlap the touch contact hole TCNT1 in the third direction (Z-axis direction).

The third color filter CF3 may overlap the driving electrode TE and the sensing electrode RE in the third direction (Z-axis direction). The third color filter CF3 may overlap the connection electrode BE1 in the third direction (Z-axis direction). The third color filter CF3 may overlap the touch contact hole TCNT1 in the third direction (Z-axis direction).

The overlapping region of the first color filter CF1 and the second color filter CF2 in the third direction (Z-axis direction) may overlap the driving electrode TE, the sensing electrode RE, and the connection electrode BE1 in the third direction (Z-axis direction). The overlapping region of the second color filter CF2 and the third color filter CF3 in the third direction (Z-axis direction) may overlap the driving electrode TE, the sensing electrode RE, and the connection electrode BE1 in the third direction (Z-axis direction). The overlapping region of the first color filter CF1 and the third color filter CF3 in the third direction (Z-axis direction) may overlap the driving electrode TE, the sensing electrode RE, and the connection electrode BE1 in the third direction (Z-axis direction).

Since the third color filter CF3 is disposed on the first color filter CF1 and the second color filter CF3 is disposed on the third color filter CF3 as shown in FIG. 23, after the first color filter CF3 is formed on the touch sensing layer SENL, the third color filter CF3 may be formed, and then second color filter CF2 may be formed. However, embodiments of the present specification are not limited thereto.

For example, the second color filter CF2 may be disposed on the first color filter CF1, and the third color filter CF3 may be disposed on the second color filter CF2. In this case, after the first color filter CF1 is formed on the touch sensing layer SENL, the second color filter CF2 may be formed, and then the third color filter CF3 may be formed.

Alternatively, any one of the first color filter CF1 and the second color filter CF2 may be disposed on the third color filter CF3, and the other one of the first color filter CF1 and the second color filter CF2 may be disposed on any one of the first color filter CF1 and the second color filter CF2. In this case, after the third color filter CF3 is formed on the touch sensing layer SENL, any one of the first color filter CF1 and the second color filter CF2 may be formed, and then the other one of the first color filter CF1 and the second color filter CF2 may be formed.

Alternatively, any one of the first color filter CF1 and the third color filter CF3 may be disposed on the second color filter CF2, and the other one of the first color filter CF1 and the third color filter CF3 may be disposed on any one of the first color filter CF1 and the third color filter CF3. In this case, after the second color filter CF2 is formed on the touch sensing layer SENL, any one of the first color filter CF1 and the third color filter CF3 may be formed, and then the other one of the first color filter CF1 and the third color filter CF3 may be formed.

As shown in FIGS. 22 and 23, the color filter layer CFL may be formed without including no black matrix, and the driving electrode TE and the sensing electrode RE include a second conductive layer serving as a low-reflective layer CL2 as shown in FIG. 8. Thus, even when the color filter layer CFL does not include a black matrix, it is possible to reduce the reflection of light incident from the outside in the driving electrode TE and the sensing electrode RE, thereby preventing the driving electrode TE and the sensing electrode RE from being visually recognized from the front surface of the display device 10 by the user. Accordingly, since a mask process for preparing the black matrix may be omitted, the manufacturing costs of the color filter layer CFL may be reduced.

As shown in FIGS. 22 and 23, the second color filter CF2 overlaps the driving electrode TE and the sensing electrode RE in the third direction (Z-axis direction). Accordingly, the second color filter CF2 may block light in the blue wavelength range reflected from the second conductive layer CL2. Therefore, it is possible to prevent or reduce the light reflected from the second conductive layer CL2 of the driving electrode TE and the sensing electrode RE from being output to the outside and thus being visually recognized by the user.

In a display device according to an embodiment of the present inventive concept, a color filter layer may be formed without including a black matrix, and a sensor electrode RE includes a conductive layer serving as a low-reflective layer to reduce the reflection of light incident from the outside. Thus, even when the color filter layer does not include a black matrix, it is possible to reduce the reflection of light incident from the outside in the sensor electrode, thereby preventing the sensor electrode from being visually recognized from the front surface of the display device by the user. Accordingly, since a mask process for preparing the black matrix may be omitted, the manufacturing costs of the color filter layer may be reduced.

In a display device according to an embodiment of the present inventive concept, any one of a first color filter and a second color filter overlaps the sensor electrode in the thickness direction of a substrate. Accordingly, any one of the first color filter and the second color filter may block light in the blue wavelength range reflected from the conductive layer. Therefore, it is possible to prevent or reduce the light reflected from the conductive layer of the sensing electrode from being output to the outside and thus being visually recognized by the user.

While the present inventive concept has been particularly shown and described with reference to the embodiments thereof, it will be understood by those of ordinary skill in the art that various changes in form and detail may be made thereto without departing from the spirit and scope of the present inventive concept.

What is claimed is:

1. A display device, comprising:
   a substrate;
   a first light emitting unit disposed on the substrate and emitting light of a first color;
   a second light emitting unit disposed on the substrate and emitting light of a second color;
   a third light emitting unit disposed on the substrate and emitting light of a third color;
   an encapsulation layer disposed on the first light emitting unit, the second light emitting unit, and the third light emitting unit;
   a sensor electrode disposed on the encapsulation layer;
   a first insulating layer disposed on the sensor electrode;
   a first color filter disposed on the first insulating layer and overlapping the first light emitting unit in a thickness direction of the substrate;
   a second color filter disposed on the first insulating layer and overlapping the second light emitting unit in the thickness direction of the substrate; and
   a third color filter disposed on the first insulating layer and overlapping the third light emitting unit in the thickness direction of the substrate,
   wherein, when the display device is viewed in a top down view, one of the first to third color filters surrounds the others, and
   wherein the sensor electrode overlaps the one of the first color filter, the second color filter, and the third color filter in the thickness direction of the substrate without overlapping the others.

2. The display device of claim 1,
   wherein when the display device is viewed in a top down view, the sensor electrode is disposed between the first light emitting unit and the second light emitting unit, and
   wherein the first color filter overlaps the sensor electrode in the thickness direction of the substrate.

3. The display device of claim 1, further comprising:
   a fourth light emitting unit disposed on the substrate and emitting the light of the second color,
   wherein the second color filter overlaps the fourth light emitting unit in the thickness direction of the substrate.

4. The display device of claim 3,
   wherein when the display device is viewed in a top down view, the sensor electrode is disposed between the second light emitting unit and the third light emitting unit, between the third light emitting unit and the fourth light emitting unit, and between the first light emitting unit and the fourth light emitting unit, and
   wherein the sensor electrode overlaps the first color filter in the thickness direction of the substrate.

5. The display device of claim 3,
   wherein when the display device is viewed in a top down view, each of the second color filter and the third color filter has an island shape which is surrounded by the first color filter.

6. The display device of claim 3,
   wherein when the display device is viewed in a top down view, the sensor electrode is disposed between the first light emitting unit and the second light emitting unit, between the second light emitting unit and the third light emitting unit, between the third light emitting unit and the fourth light emitting unit, and between the first light emitting unit and the fourth light emitting unit, and
   wherein the second color filter overlaps the sensor electrode in the thickness direction of the substrate.

7. The display device of claim 3,
   wherein when the display device is viewed in a top down view, each of the first color filter and the third color filter has an island shape which is surrounded by the second color filter.

8. The display device of claim 7,
   wherein an entire area of the second color filter is larger than an entire area of the third color filter.

9. The display device of claim 3,
   wherein when the display device is viewed in a top down view, the sensor electrode is disposed between the first light emitting unit and the second light emitting unit and between the first light emitting unit and the fourth light emitting unit, and
   wherein the first color filter and the second color filter overlaps the sensor electrode in the thickness direction of the substrate.

10. The display device of claim 3,
    wherein when the display device is viewed in a top down view, the sensor electrode is disposed between the second light emitting unit and the third light emitting unit and between the third light emitting unit and the fourth light emitting unit, and
    wherein the second color filter overlaps the sensor electrode in the thickness direction of the substrate.

11. The display device of claim 1,
    wherein the sensor electrode includes:
    a first conductive layer; and
    a second conductive layer disposed on the first conductive layer,
    wherein a thickness of the first conductive layer is greater than a thickness of the second conductive layer,
    wherein an electrical conductivity of the first conductive layer is higher than an electrical conductivity of the second conductive layer,
    wherein a reflectance of the first conductive layer is higher than a reflectance of the second conductive layer, and
    wherein the reflectance of the second conductive layer is low such that the sensor electrode is prevented from being visually recognized from the outside of the display device.

12. The display device of claim 1,
    wherein the sensor electrode includes:
    a first conductive layer; and
    a second conductive layer disposed on the first conductive layer,
    wherein the first conductive layer includes aluminum, silver, copper, or an alloy thereof, and
    wherein the second conductive layer includes an oxide containing molybdenum and tantalum.

13. A display device, comprising:
a substrate;
a first light emitting unit disposed on the substrate and emitting light of a first color;
a second light emitting unit disposed on the substrate and emitting light of a second color;
a third light emitting unit disposed on the substrate and emitting light of a third color;
a fourth light emitting unit disposed on the substrate and emitting the light of the second color;
an encapsulation layer disposed on the first light emitting unit, the second light emitting unit, and the third light emitting unit;
a sensor electrode disposed on the encapsulation layer;
a first insulating layer disposed on the sensor electrode;
a first color filter disposed on the first insulating layer and overlapping the first light emitting unit in a thickness direction of the substrate;
a second color filter disposed on the first insulating layer and overlapping the second light emitting unit and the fourth light emitting unit in the thickness direction of the substrate; and
a third color filter disposed on the first insulating layer and overlapping the third light emitting unit in the thickness direction of the substrate,
wherein when the display device is viewed in a top down view, the sensor electrode is disposed between the second light emitting unit and the third light emitting unit and between the third light emitting unit and the fourth light emitting unit, and
wherein the sensor electrode overlaps the first color filter in the thickness direction of the substrate without overlapping the second and third color filters.

14. The display device of claim 13,
wherein when the display device is viewed in a top down view, the second color filter has an island shape from a plan view.

15. A display device, comprising:
a substrate;
a first light emitting unit disposed on the substrate and emitting light of a first color;
a second light emitting unit disposed on the substrate and emitting light of a second color;
a third light emitting unit disposed on the substrate and emitting light of a third color;
a fourth light emitting unit disposed on the substrate and emitting the light of the second color,
an encapsulation layer disposed on the first light emitting unit, the second light emitting unit, and the third light emitting unit;
a sensor electrode disposed on the encapsulation layer;
a first insulating layer disposed on the sensor electrode;
a first color filter disposed on the first insulating layer and overlapping the first light emitting unit in a thickness direction of the substrate;
a second color filter disposed on the first insulating layer and overlapping the second light emitting unit and the fourth light emitting unit in the thickness direction of the substrate; and
a third color filter disposed on the first insulating layer and overlapping the third light emitting unit in the thickness direction of the substrate,
wherein when the display device is viewed in a top down view, the sensor electrode is disposed between the second light emitting unit and the third light emitting unit and between the third light emitting unit and the fourth light emitting unit, and at least one of the first to third color filters (CF1-CF3) surrounds the others (CF2 and CF3 surrounding CF1) (FIGS. 20-21); and
wherein the second color filter and the third color filter overlap the sensor electrode in the thickness direction of the substrate.

16. The display device of claim 15,
wherein when the display device is viewed in a top down view, the first color filter has an island shape.

17. The display device of claim 15,
wherein a crossing portion of the sensor electrode is disposed between the first light emitting unit and the third light emitting unit in a first direction and between the second light emitting unit and the fourth light emitting unit in a second direction intersecting the first direction, and
wherein the first color filter, the second color filter, and the third color filter overlap the crossing portion of the sensor electrode in the thickness direction of the substrate.

18. The display device of claim 15,
wherein when the display device is viewed in a top down view, the sensor electrode is disposed between the first light emitting unit and the second light emitting unit and between the first light emitting unit and the fourth light emitting unit, and
wherein the second color filter overlaps the sensor electrode in the thickness direction of the substrate.

19. A display device, comprising:
a substrate;
a first light emitting unit disposed on the substrate and emitting light of a first color;
an encapsulation layer disposed on the first light emitting unit;
a sensor electrode disposed on the encapsulation layer, and
a first color filter disposed on the sensor electrode and overlapping the first light emitting unit in a thickness direction of the substrate,
wherein:
the sensor electrode, when the display device is viewed in a top down view, does not overlap the first light emitting unit in the thickness direction of the substrate,
the first color filter overlaps the sensor electrode in the thickness direction of the substrate,
the sensor electrode includes a first conductive layer, a second conductive layer disposed on the first conductive layer, and a third conductive layer disposed on the second conductive layer, and
a thickness of the first conductive layer is greater than a thickness of the second conductive layer and a thickness of the third conductive layer, an electrical conductivity of the first conductive layer is higher than an electrical conductivity of the second conductive layer and an electrical conductivity of the third conductive layer, and a reflectance of the second conductive layer is lower than a reflectance of the first conductive layer and a reflectance of the third conductive layer.

20. A display device, comprising:
a substrate;
a first light emitting unit disposed on the substrate and emitting light of a first color;
a second light emitting unit disposed on the substrate and emitting light of a second color;
a third light emitting unit disposed on the substrate and emitting light of a third color;
a fourth light emitting unit disposed on the substrate and emitting the light of the second color;

an encapsulation layer disposed on the first light emitting unit, the second light emitting unit, and the third light emitting unit;
a sensor electrode disposed on the encapsulation layer;
a first insulating layer disposed on the sensor electrode;
a first color filter disposed on the first insulating layer and overlapping the first light emitting unit in a thickness direction of the substrate;
a second color filter disposed on the first insulating layer and overlapping the second light emitting unit in the thickness direction of the substrate; and
a third color filter disposed on the first insulating layer and overlapping the third light emitting unit in the thickness direction of the substrate,
wherein, when the display device is viewed in a top down view, one of the first to third color filters surrounds the others,
wherein the second color filter overlaps the fourth light emitting unit in the thickness direction of the substrate,
wherein when the display device is viewed in a top down view, the sensor electrode is disposed between the first light emitting unit and the second light emitting unit and between the first light emitting unit and the fourth light emitting unit, and
wherein the first color filter and the second color filter overlaps the sensor electrode in the thickness direction of the substrate, and
wherein the third color filter does not overlap the sensor electrode in the thickness direction of the substrate.

* * * * *